(12) United States Patent
Yu et al.

(10) Patent No.: US 10,916,529 B2
(45) Date of Patent: Feb. 9, 2021

(54) ELECTRONICS CARD INCLUDING MULTI-CHIP MODULE

(71) Applicant: Taiwan Semiconductor Manufacturing Company, Ltd., Hsinchu (TW)

(72) Inventors: Chen-Hua Yu, Hsinchu (TW); Chien-Hsun Lee, Chu-tung Town (TW); Jiun Yi Wu, Zhongli (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/160,516

(22) Filed: Oct. 15, 2018

(65) Prior Publication Data

US 2019/0304959 A1 Oct. 3, 2019

Related U.S. Application Data

(60) Provisional application No. 62/649,772, filed on Mar. 29, 2018.

(51) Int. Cl.
*H01L 21/56* (2006.01)
*H01L 21/48* (2006.01)
(Continued)

(52) U.S. Cl.
CPC ........ *H01L 25/105* (2013.01); *H01L 21/4857* (2013.01); *H01L 21/561* (2013.01); *H01L 23/3121* (2013.01); *H01L 23/367* (2013.01); *H01L 23/49822* (2013.01); *H01L 24/08* (2013.01); *H01L 24/94* (2013.01); *H01L 25/0655* (2013.01); *H01L 25/50* (2013.01);
(Continued)

(58) Field of Classification Search
CPC ... H01L 21/4857; H01L 21/561; H01L 23/13; H01L 23/3121; H01L 23/3128; H01L 23/367; H01L 23/3677; H01L 23/49822; H01L 23/5389
See application file for complete search history.

(56) References Cited

U.S. PATENT DOCUMENTS

| 5,814,883 A | 9/1998 | Sawai et al. |
| 6,949,835 B2 | 9/2005 | Konishi et al. |

(Continued)

FOREIGN PATENT DOCUMENTS

| CN | 102169875 A | 8/2011 |
| CN | 103779319 A | 5/2014 |

(Continued)

*Primary Examiner* — Joseph M Galvin, III
(74) *Attorney, Agent, or Firm* — Slater Matsil, LLP

(57) ABSTRACT

A method includes bonding a first package to a second package to form a third package. The first package is an Integrated Fan-Out (InFO) package including a plurality of package components, and an encapsulating material encapsulating the plurality of package components therein. The plurality of package components include device dies. The method further includes placing at least a portion of the third package into a recess in a Printed Circuit Board (PCB). The recess extends from a top surface of the PCB to an intermediate level between the top surface and a bottom surface of the PCB. Wire bonding is performed to electrically connect the third package to the PCB.

21 Claims, 27 Drawing Sheets

(51) Int. Cl.
*H01L 25/10* (2006.01)
*H01L 23/31* (2006.01)
*H01L 25/065* (2006.01)
*H01L 23/00* (2006.01)
*H01L 23/498* (2006.01)
*H01L 25/00* (2006.01)
*H01L 23/367* (2006.01)

(52) U.S. Cl.
CPC ............... *H01L 2224/08225* (2013.01); *H01L 2225/1023* (2013.01); *H01L 2225/1058* (2013.01)

(56) References Cited

U.S. PATENT DOCUMENTS

| | | | |
|---|---|---|---|
| 8,981,514 | B2 | 3/2015 | Ryu et al. |
| 9,773,757 | B2 | 9/2017 | Yu et al. |
| 10,008,470 | B2 | 6/2018 | Beer et al. |
| 10,062,648 | B2 | 8/2018 | Hsieh et al. |
| 2006/0249828 | A1* | 11/2006 | Hong ................ H01L 25/03 257/686 |
| 2011/0210444 | A1* | 9/2011 | Jeng ................ H01L 23/49827 257/738 |
| 2012/0319288 | A1* | 12/2012 | Birge ................ H01L 23/13 257/773 |
| 2015/0084170 | A1* | 3/2015 | Im ................ H01L 23/49833 257/675 |
| 2015/0235936 | A1 | 8/2015 | Yu et al. |
| 2017/0207197 | A1* | 7/2017 | Yu ................ H01L 24/32 |
| 2017/0207204 | A1 | 7/2017 | Lin et al. |
| 2017/0250138 | A1* | 8/2017 | Hsieh ................ H01L 25/105 |

FOREIGN PATENT DOCUMENTS

| | | |
|---|---|---|
| CN | 106981475 A | 7/2017 |
| CN | 107134437 A | 9/2017 |
| JP | 2004296613 A | 10/2004 |
| KR | 100228595 B1 | 11/1999 |
| KR | 20130084493 A | 7/2013 |

* cited by examiner

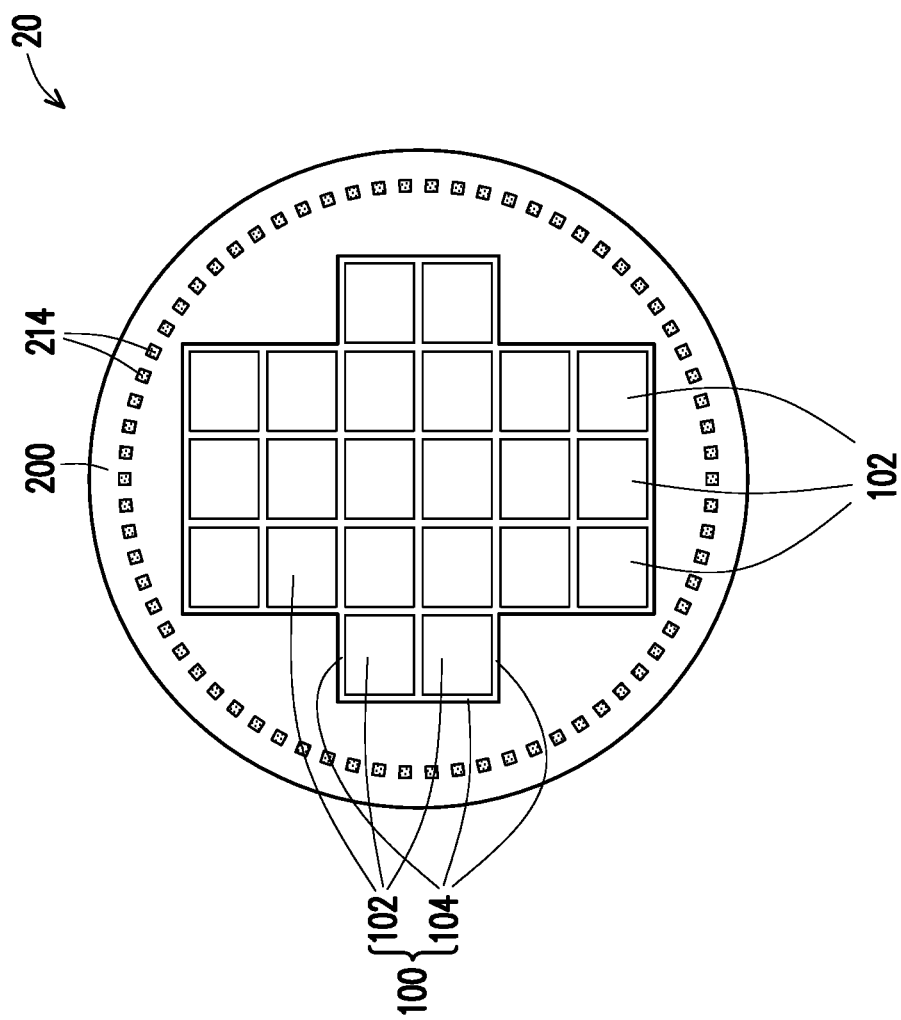

ELECTRONICS CARD INCLUDING MULTI-CHIP MODULE

PRIORITY CLAIM AND CROSS-REFERENCE

This application claims the benefit of the following provisionally filed U.S. Patent application: Application Ser. No. 62/649,772, filed Mar. 29, 2018, and entitled "INFO ON RECESSED PCB," which application is hereby incorporated herein by reference.

BACKGROUND

Today's High Performance Computing (HPC) systems may include a plurality of independent cards or boards connected to a main system. The independent cards or boards are connected through cable wires. The cards or boards are formed by sawing wafers to form device dies, and packaging the device dies to form packages. The packages are mounted on a surface of a printed circuit board, which is then assembled to form a card or a board. A plurality of cards or boards are assembled into a rack of a system, so that the plurality of cards or boards are electrically interconnected. This system has limited bandwidth and performance, and hence its usage in high-frequency applications is limited.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6, 7A, 7B, 8 and 9 illustrate the top views and cross-sectional views of intermediate stages in the formation of an electronics card in accordance with some embodiments.

DETAILED DESCRIPTION

Figure 1:
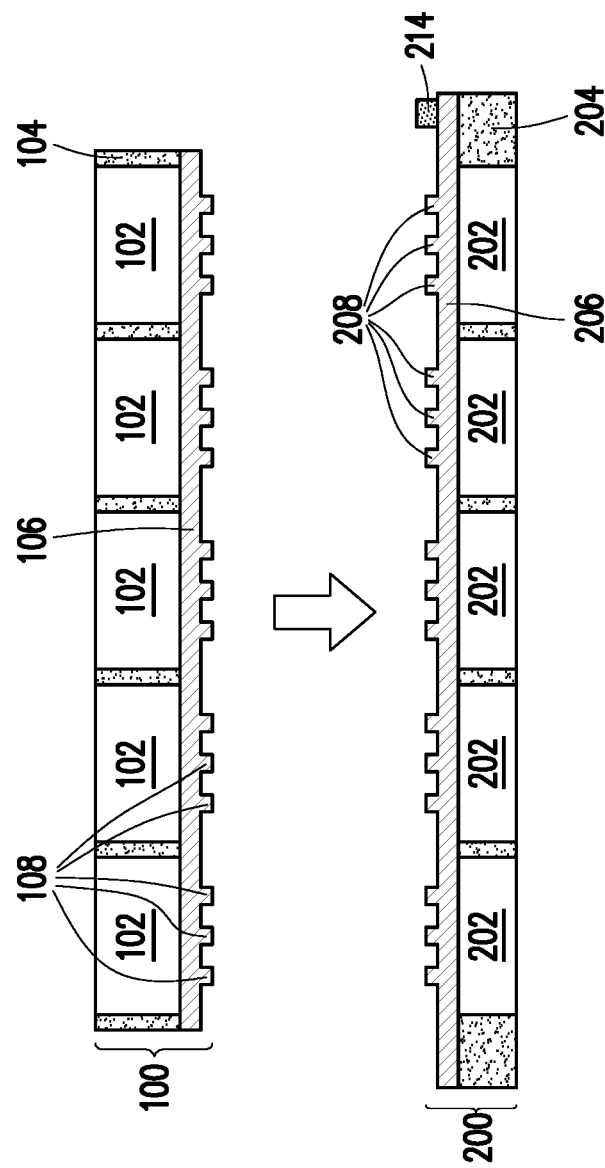

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Packages or electronics cards and the methods of forming the same are provided in accordance with various embodiments. Multiple package components are integrated into reconstructed wafers, which are bonded together at wafer level to form, for example, a package or an electronics card. The integration level of the resulting package is thus improved, and a system may be integrated into bonded wafers. The intermediate stages of forming packages or electronics card are illustrated in accordance with some embodiments. Some variations of some embodiments are discussed. Throughout the various views and illustrative embodiments, like reference numbers are used to designate like elements.

Figure 26:
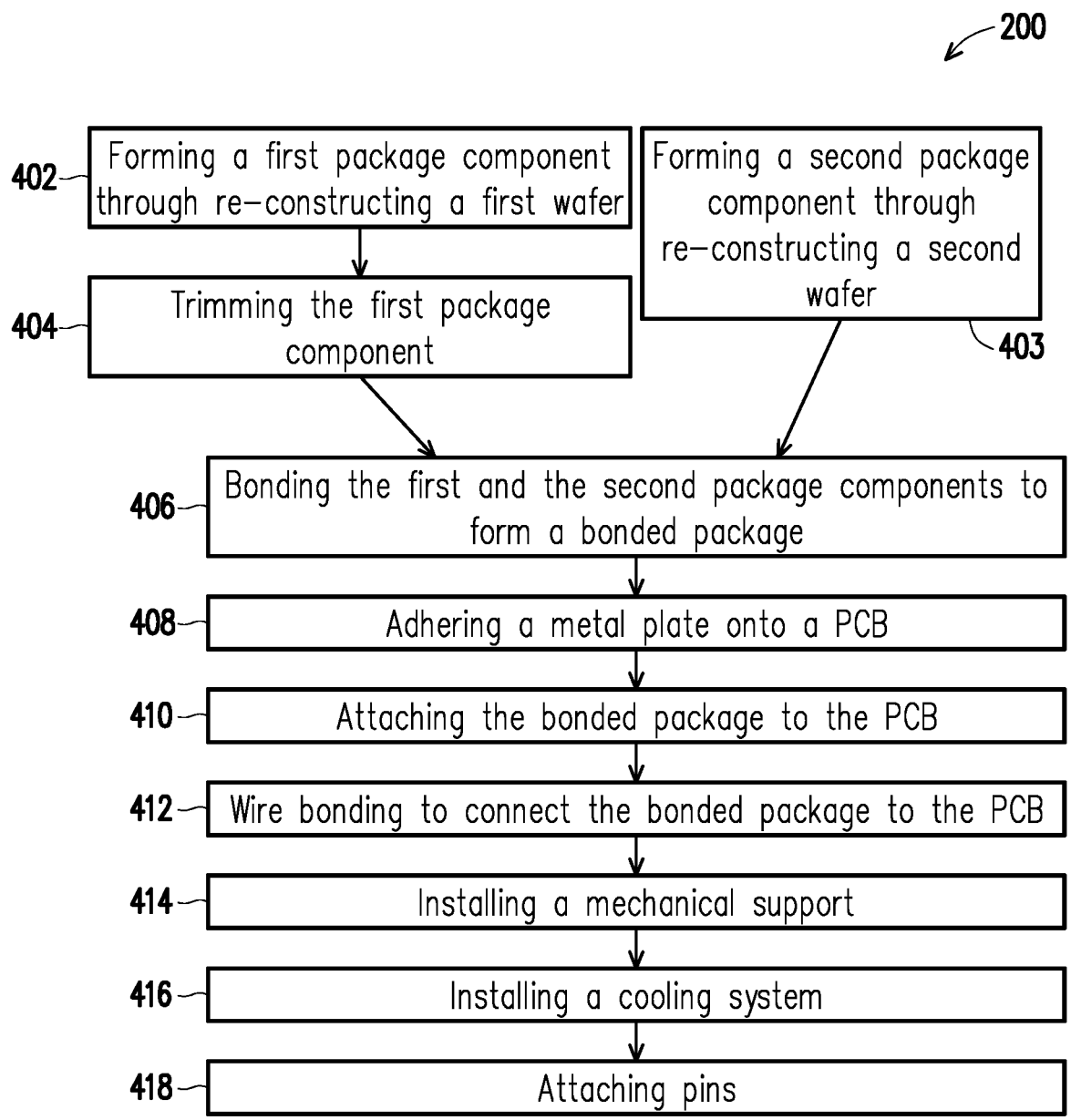
FIG. 26 illustrates a process flow for forming an electronics card in accordance with some embodiments.

FIGS. 1 through 9 illustrate the cross-sectional views and top views of intermediate stages in the formation of an electronics card (or a package) in accordance with some embodiments of the present disclosure. The steps shown in FIGS. 1 through 9 are also reflected schematically in the process flow shown in FIG. 26.

FIG. 1 illustrates package component 100 and package component 200, with an alignment being performed to align package component 100 to package component 200. In accordance with some embodiments of the present disclosure, package components 100 and 200 are at wafer level, which means that package components 100 and 200 are formed as wafers, and are not sawed into individual (which are identical) packages that comprising devices. The sizes of package components 100 and 200 are the same as, or close to, the sizes of semiconductor wafers. For example, package components 100 and 200 may be 4-inch wafers, 6-inch wafers, 12-inch wafers, or larger. Package components 100 and 200 in accordance with some embodiments are referred to as multi-chip modules or re-constructed wafers. Package components 100 and 200 are also referred to as system-on-wafer packages since they include different types of device dies and packages for forming a system. For example, package components 100 and 200 individually or in combination may form an artificial intelligence system, which may include a plurality of core chips for parallel calculation, and a plurality of different types of memories for storage.

Package component 100 includes package components 102 therein, which are encapsulated by encapsulating material (encapsulant) 104. Interconnect structure 106 is formed on package components 102 and encapsulating material 104, and is used for electrically connecting to the integrated circuit devices in package components 102. Interconnect structure 106 also interconnects package components 102. In FIG. 1, interconnect structure 106 is shown schematically, and the details in interconnect structure 106 may be found referring to FIG. 24. Package component 100 further includes electrical connectors 108 for bonding. In accordance with some embodiments of the present disclosure, electrical connectors 108 include solder regions, metal pillars, metal pads, or the like.

Figure 24:
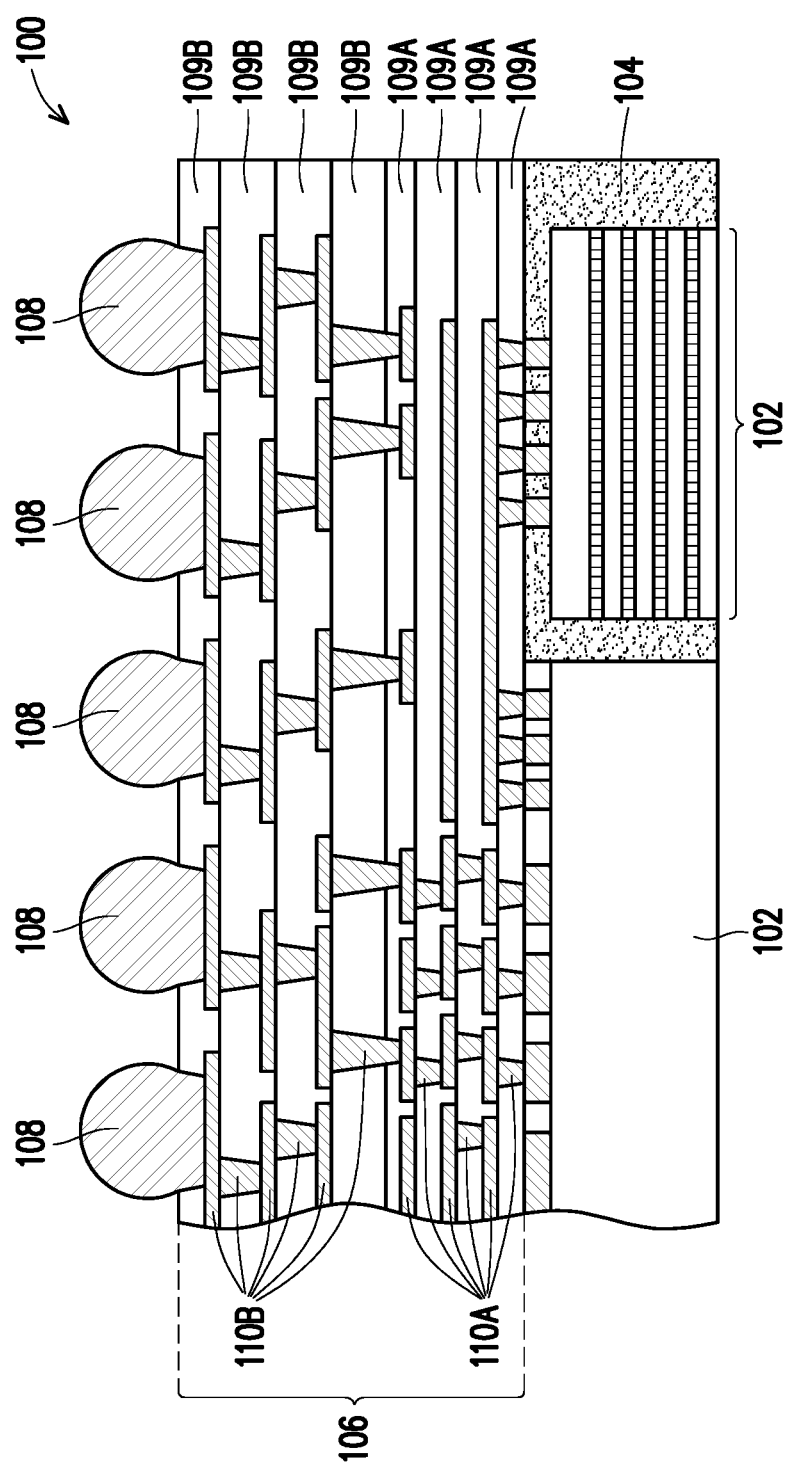
FIGS. 24 and 25 illustrate the cross-sectional views of reconstructed wafers in accordance with some embodiments.

Package component 200 includes package components 202 therein, which are encapsulated by encapsulating material (encapsulant) 204. Interconnect structure 206 is formed on package components 202 and encapsulating material 204, and is used for electrically connecting to the integrated circuit devices in package components 202. Interconnect structure 206 also interconnects package components 202. In FIG. 1, interconnect structure 206 is shown schematically, and the details in interconnect structure 206 are similar to what are shown in FIG. 24. Hence, the discussion of the details of interconnect structure 106 in subsequent paragraphs also applies to interconnect structure 206. Package component 200 further includes electrical connectors 208 for bonding. In accordance with some embodiments of the present disclosure, electrical connectors 208 include solder regions, metal pillars, metal pads, or the like.

In accordance with some embodiments of the present disclosure, package components 102 and 202 may be any of the device dies (such as logic dies and memory dies), System-on-Chip dies, packages, High Bandwidth Memory (HBM) packages, digital dies, analog dies, surface-mount passive devices, or the like. Some of package components 102 may have structures different from each other, while some other package components 102 may be the same as each other. Some of package components 202 may also have structures and functions different from each other, while some other package components 202 may be the same as each other. Package components 102 and 202 may include multiple types of dies as aforementioned, which are interconnected through interconnect structures 106 and 206 (after they are bonded together) to form an integrated system. The sizes, thicknesses, and the integration levels of package components 102 may be different from each other. The sizes, thicknesses, and the integration levels of package components 202 may be different from each other, and may be different from that of package components 102.

FIG. 24 illustrates a cross-sectional view of a portion of package component 100. It is appreciated that package component 200 may also have similar structures as package component 100 in accordance with some embodiments of the present disclosure. Accordingly, the description of package component 100 may also apply to package component 200. The details of package component 200 are thus not shown and discussed separately, and may be found referring to that of package component 100. In accordance with some embodiments of the present disclosure, in the illustrated example, package components 102 include a discrete device die, which is sawed from a wafer. Package component 102 may further include a High-Bandwidth Memory (HBM) stack. Encapsulating material 104 may include a molding compound, a molding underfill, underfill, or the like, which may include particles mixed in a base material. The filler particles may be the particles of a dielectric material(s) such as $SiO_2$, $Al_2O_3$, silica, or the like, and may have spherical shapes. Also, the spherical filler particles may have the same or different diameters. The base material may include a polymer, a resin, an epoxy, or the like.

Interconnect structure 106 includes a plurality of dielectric layers 109, which includes dielectric layers 109A and 109B. Dielectric layers 109B may be formed of polymers such as polyimide, polybenzoxazole (PBO), Ajinomoto Build-up Film (ABF), prepreg (with filler and/or fiber therein), solder resist, or the like. Dielectric layers 109A may be formed of organic materials such as PBO, polyimide, or the like, and/or inorganic dielectric materials. Interconnect structure 106 further includes Redistribution Lines (RDLs) 110 (including 110A and 110B) formed in dielectric layers 109 to electrically connect to the devices in package components 102. RDLs no may be formed of copper, aluminum, nickel, titanium, tantalum, titanium nitride, tantalum nitride, or multi-layers thereof. RDLs no may or may not include glue layers (also referred to as barrier layers), which may be formed of titanium, tantalum, titanium nitride, tantalum nitride, or the like. The glue layers may be thinner than the overlying portions of the RDLs. For example, the thickness of the glue layers may be about 5 percent to about 10 percent of the thickness of the corresponding RDLs.

In accordance with some embodiments of the present disclosure, RDLs 110B, which are formed in dielectric layers 109B, are thicker and wider than RDLs 110A, which are formed in dielectric layers 109A. In accordance with some embodiments of the present disclosure, RDLs 110A are used for local connections, and may be used for signal routing between neighboring package components 102. RDLs 110B may be used as global lines such as power lines, ground lines, or the like, or used as signal lines connecting package components 102 that are not close to each other. Electrical connectors 108 are formed on the surface of package component 100. In accordance with some embodiments of the present disclosure, electrical connectors 108 include solder regions. In accordance with other embodiments of the present disclosure, electrical connectors 108 include metal bumps, metal pads, or metal bumps and solder regions on top of the metal bumps.

The formation of package component 100 is discussed briefly as follows. The respective process is illustrated as process 402 in the process flow shown in FIG. 26. Package component 200 may be formed using a process similar to the formation of package component 100, and the respective process is illustrated as process 403 in the process flow shown in FIG. 26. In accordance with some embodiments of the present disclosure, the formation of package component 100 includes coating a release film (such as a Light-To-Heat-Conversion (LTHC) coating) on a carrier, placing the package components 102 on the carrier through die-attach films (adhesive films), encapsulating package components 102 in encapsulating material 104, and performing a planarization process such as a Chemical Mechanical Polish (CMP) process or a mechanical grinding process to remove excess portions of the encapsulating material, so that the electrical connectors (such as metal pillars) of package components 102 are exposed.

Interconnect structure 106 is then formed on package components 102 and encapsulating material 104. In accordance with some embodiments of the present disclosure, the formation of interconnect structure 106 includes forming dielectric layers and the corresponding RDLs layer-by-layer. For example, the formation of a dielectric layer and a corresponding layer of RDLs includes depositing the dielectric layer, patterning the dielectric layer to form openings, through which underlying conductive features are exposed, depositing a metal seed layer, forming a patterned mask, plating RDLs in the patterned mask, removing the patterned mask, and etching the portions of the metal seed layer previously covered by the patterned mask. Electrical connectors 108 are formed either through plating and/or through solder-ball placement. After the formation of interconnect structure 106, the carrier may be demounted, for example, by projecting a laser beam on the release film to decompose the release film. Package component 100 is thus formed.

Figure 2:
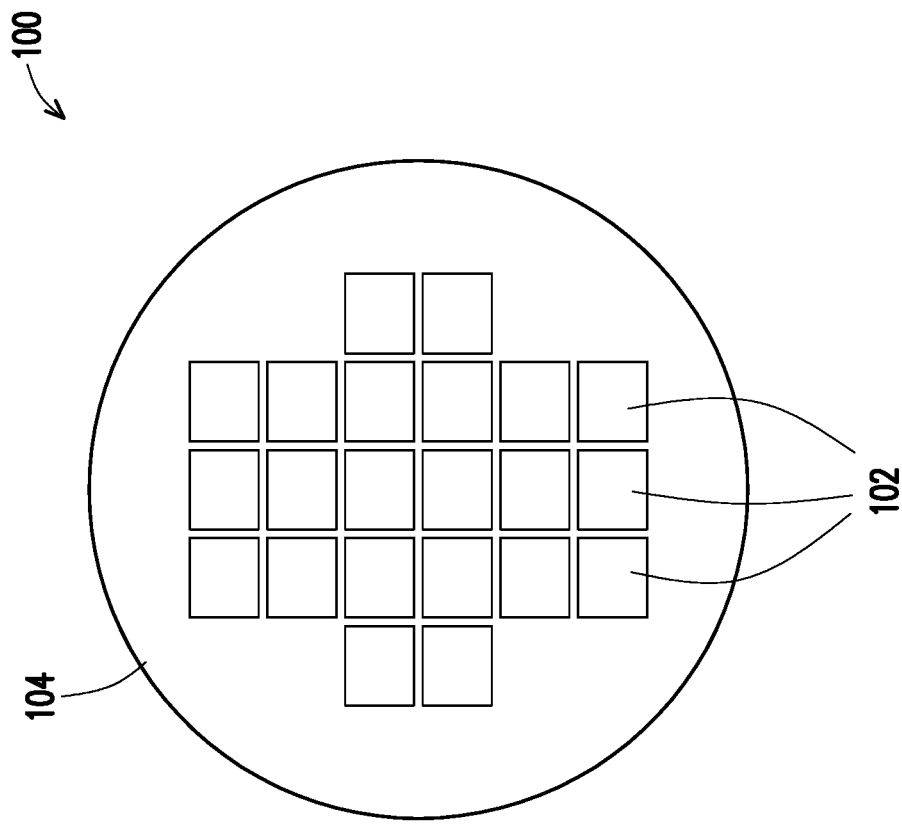

FIG. 2 illustrates a top view of package components 102 and encapsulating material 104 in package component 100. In accordance with some embodiments of the present disclosure, the sizes of some of package components 102 may be different from each other, while some of package components 102 may have the same sizes. Also, the shapes of some of package components 102 may be different from each other, while some of package components 102 may have identical shapes.

Figure 3:
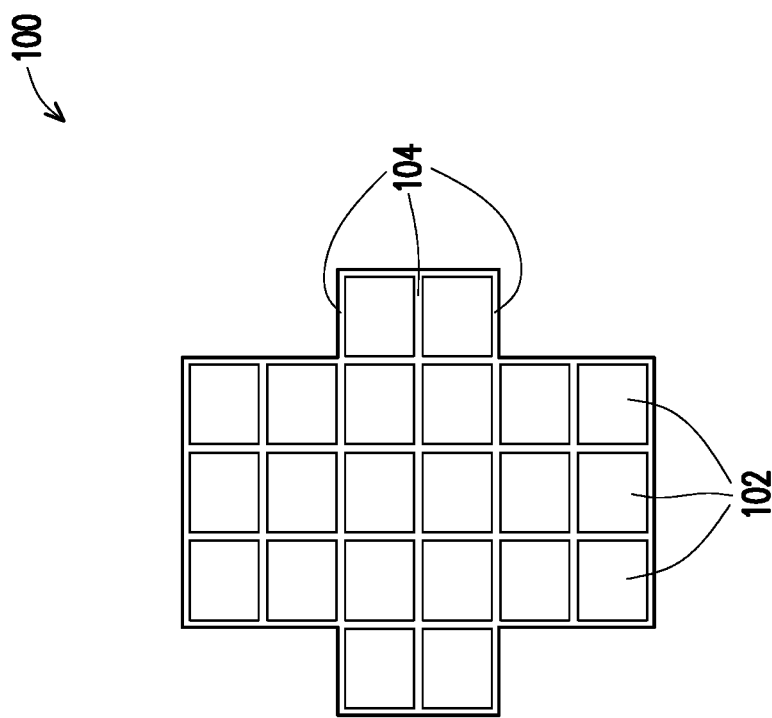

FIG. 3 illustrates the trimming of package component 100 in accordance with some embodiments. The respective process is illustrated as process 404 in the process flow shown in FIG. 26. In the trimming step, the edge portions of package component 100, which edge portions do not include active devices and RDLs therein, are removed in order to reduce the size of package component 100. The trimming may be performed through a cutting blade, a laser beam, a router, or the like, depending on the shape and the thickness of package component 100. After the trimming step, all of the package components 102 and RDLs remain to be in the same wafer without being separated into different packages. In accordance with some embodiments in which package component 100 is smaller than package component 200, the trimming may or may not be performed.

Figure 4:
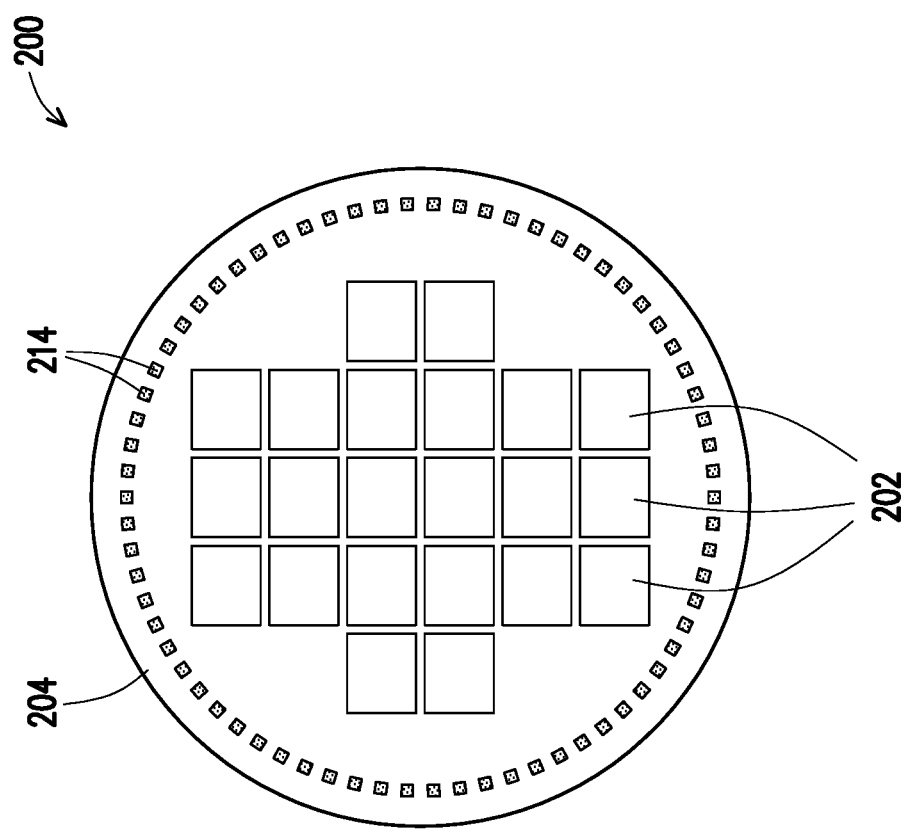

FIG. 4 illustrates a top view of package components 202 and encapsulating material 204 in package component 200. In accordance with some embodiments of the present disclosure, the sizes of package components 202 may be different from each other, while some of package components 202 may have the same sizes. Also, the shapes of some of package components 202 may be different from each other, while some other package components 202 may have identical shapes. Bond pads 214 are formed in the peripheral region, and on the surface, of package component 200. Some of bond pads 214 are electrically connected to package components 202. Some other bond pads 214 are not electrically connected to package components 202, and will be electrically connected to package components 102 (FIG. 9) once package component 100 is bonded to package component 200. Some bond pads 214 (such as the power and ground pads) may also be connected to package components 202, and will also be electrically connected to package components 102 once package component 100 is bonded to package component 200.

Figure 5A:
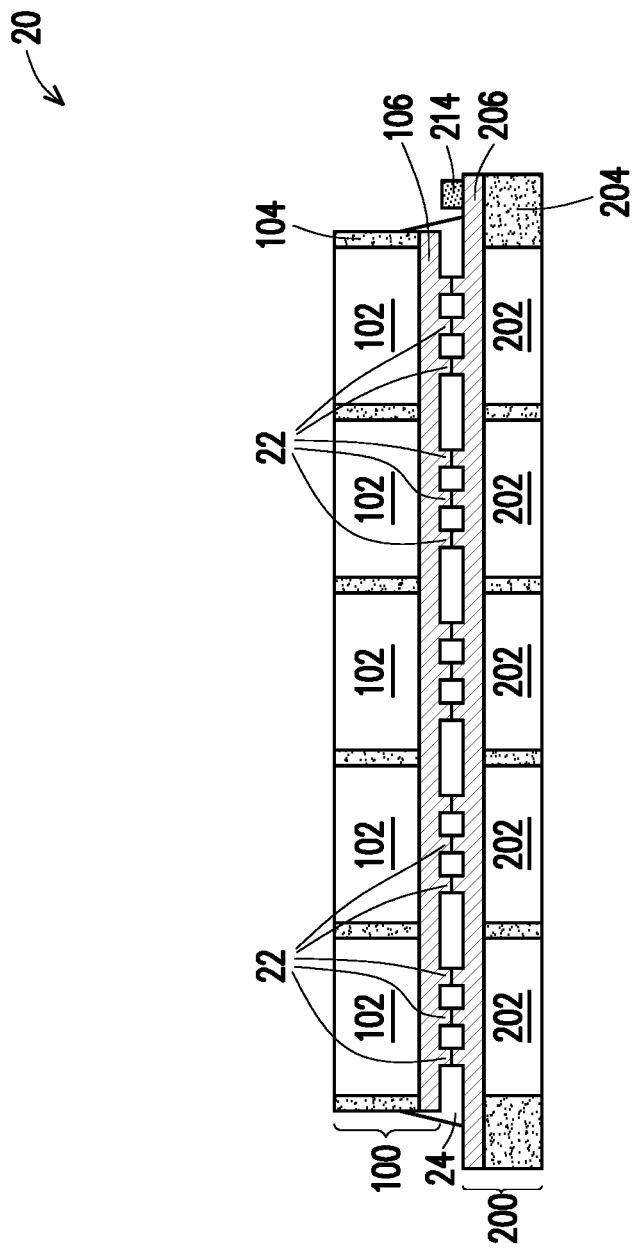

FIGS. 5A and 5B illustrate a cross-sectional view and a top view, respectively, in the bonding of package component 100 to package component 200. The respective process is illustrated as process 406 in the process flow shown in FIG. 26. The bonding may be achieved through solder bonding, metal-to-metal-direct bonding, hybrid bonding, or the like. In accordance with some embodiments of the present disclosure, the bonding is performed using laser ablation. For example, a laser beam is generated to have a size much larger than the size of a typical laser beam. A laser-beam generator (not shown) may be configured to enlarge a small laser beam to a desirable larger size. Package component 100 is divided into a plurality of sub regions, and the laser ablation includes multiple laser shots, each projected on one of the plurality of sub regions. When the laser is projected on one of the sub regions of package component 100, the solder regions directly underlying the respective sub region are reflowed. Accordingly, by bonding package components 100 and 200 sub-region-by-sub-region, the entire package component 100 is bonded to package component 200, forming package 20. Electrical connectors 108 and 208 are joined to form electrical connectors 22, which may be reflowed solder regions, solder regions and metal pillars bonded together, or metal bumps bonded together. After the bonding, underfill 24 may be dispensed into the gap between package components 100 and 200, and then cured.

FIG. 5B illustrates a top view of the package 20 as shown in FIG. 5A. As shown in FIGS. 5A and 5B, bond pads 214, which may be formed on the edge regions of package component 200, are not covered by package component 100. The trimming of package component 100 removes the portions of package components 100 covering bond pads 214 when the originally formed reconstructed wafers 100 and 200 are of the same size. It is appreciated that although package components 102 are shown as overlapping the corresponding package components 202 in package component 200, the layout and the sizes of package components 102 may be totally different from, and are not related to, that of package components 202. Some of package components 102 may overlap, and bonded to, multiple package components 202, and vice versa.

Figure 6:
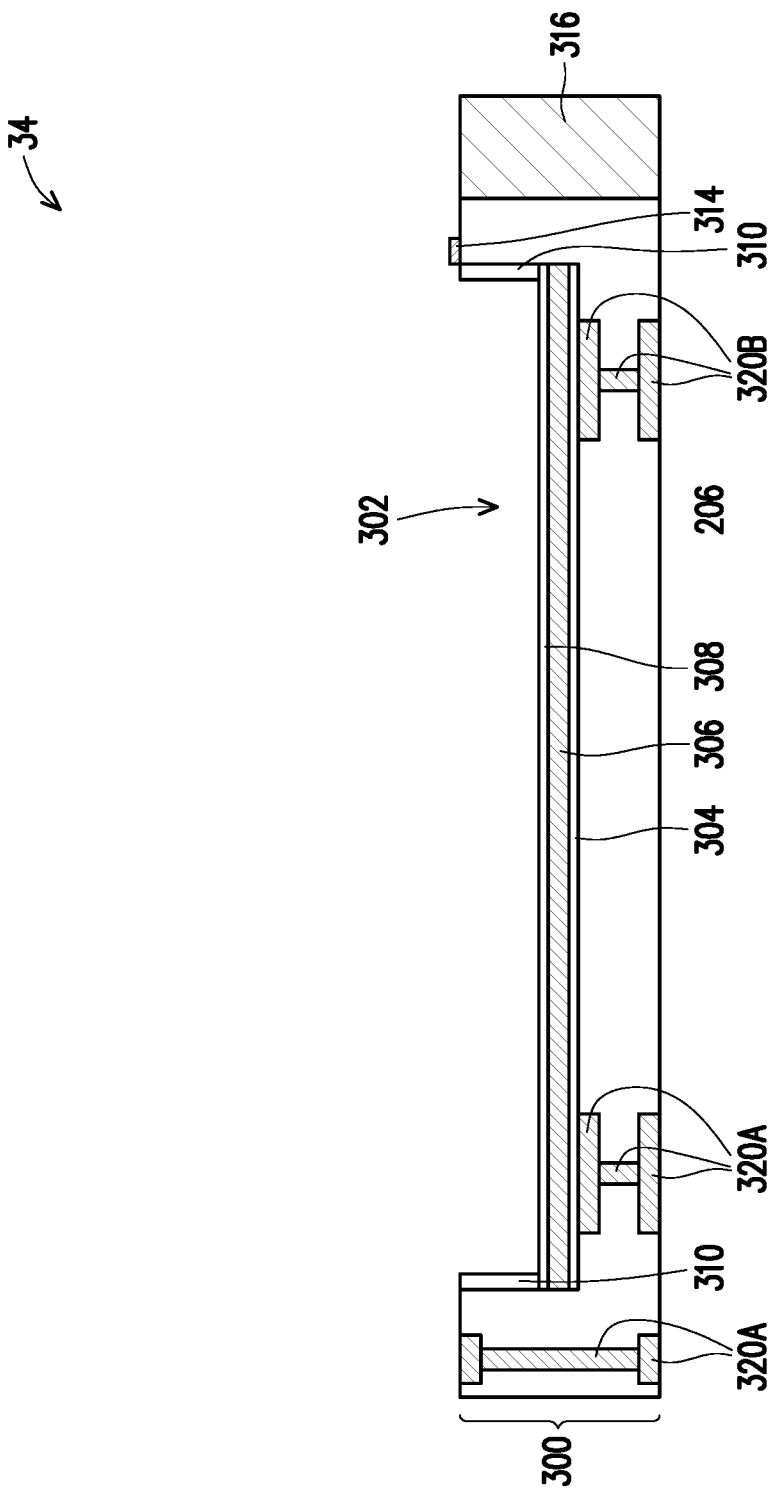

FIG. 6 illustrates a cross-sectional view of package component 300. In accordance with some embodiments of the present disclosure, package component 300 is a Printed Circuit Board (PCB), and hence is referred to as PCB 300 hereinafter, while package component 300 may be of other types. In accordance with some embodiments of the present disclosure, PCB 300 includes wafer-size recess 302 extending from the top surface of PCB 300 to an intermediate level of PCB 300. In accordance with other embodiments of the present disclosure, recess 302 is not formed. Bond pads 314 are formed on the top surface of PCB 300, and may be arranged to align to a ring encircling recess 302. Electrical connectors 316 are formed aligned to a side (such as the right side as in FIG. 7B) of PCB 300. Electrical connectors 316 are electrically connected to bond pads 314, and may extend to the edge of PCB 300.

In accordance with some embodiments of the present disclosure, metal plate 306 is adhered on the top surface of PCB 300. Metal plate 306 may be placed in recess 302 (when formed). The respective process is illustrated as process 408 in the process flow shown in FIG. 26. Metal plate 306 may be formed of copper, aluminum, stainless steel, or the like, and is used for redistributing and conducting heat. Metal plate 306 may be adhered to PCB 300 through Thermal Interface Material (TIM) 304. TIM 308 may be formed over metal plate 306. TIMs 304 and 308 may have thermal conductivity values higher than about 1 W/k*m, higher than about 5 W/k*m, higher than about 20 W/k*m, higher than about 50 W/k*m, or higher. Adhesive 310 is dispensed in recess 302, and may be dispensed as a ring along the sidewalls of recess 302.

In accordance with some embodiments of the present disclosure, PCB 300 includes conductive traces 320 (including 320A and 320B), which are shown schematically, and may include conductive lines and vias. Conductive traces 320 may be formed of copper, aluminum, titanium, tungsten, or the like. Conductive traces 320 may include a plurality of layers, which in combination penetrate through PCB 300. Conductive traces 320 may include active traces 320A for routing signals, power, electrical ground, etc., which may be electrically connected to bond pads 314. Conductive traces 320 may also include traces 320B, which do not have electrical function, and are electrically disconnected from all devices and circuits in package components 100 and 200 in the final package. Traces 320B may be electrically floating in accordance with some embodiments of the present disclosure, and are referred to as dummy traces. Conductive traces 320B are used for conducting heat generated in package components 100 and 200 to the bottom side of PCB 300. The PCB 300 may be single-sided, with conductive traces formed on the top side, but not on the bottom side. PCB 300 may also be formed as double-sided, as illustrated in FIG. 6, with conductive traces formed on both the top side and the bottom side.

Figure 7A:
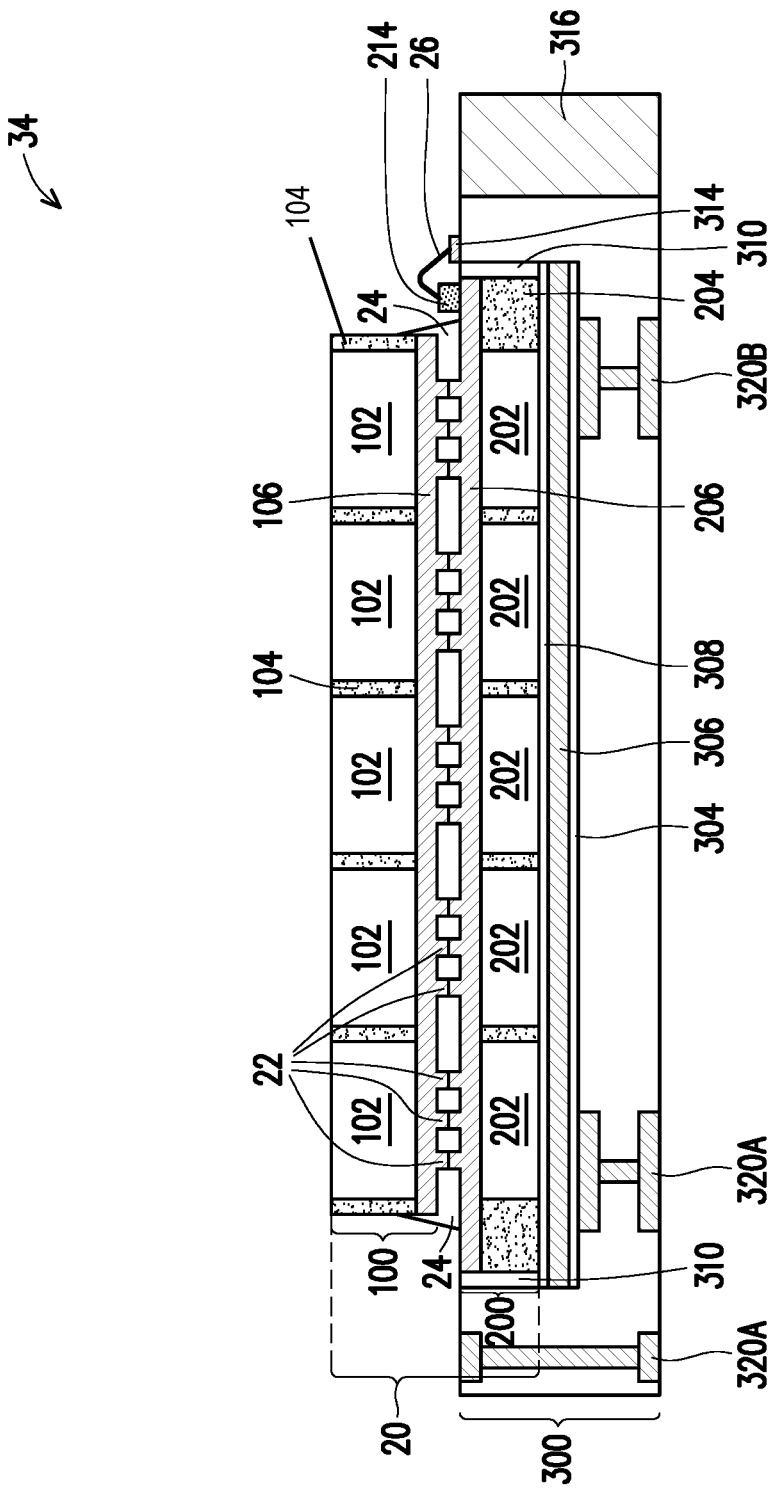
Figure 7B:
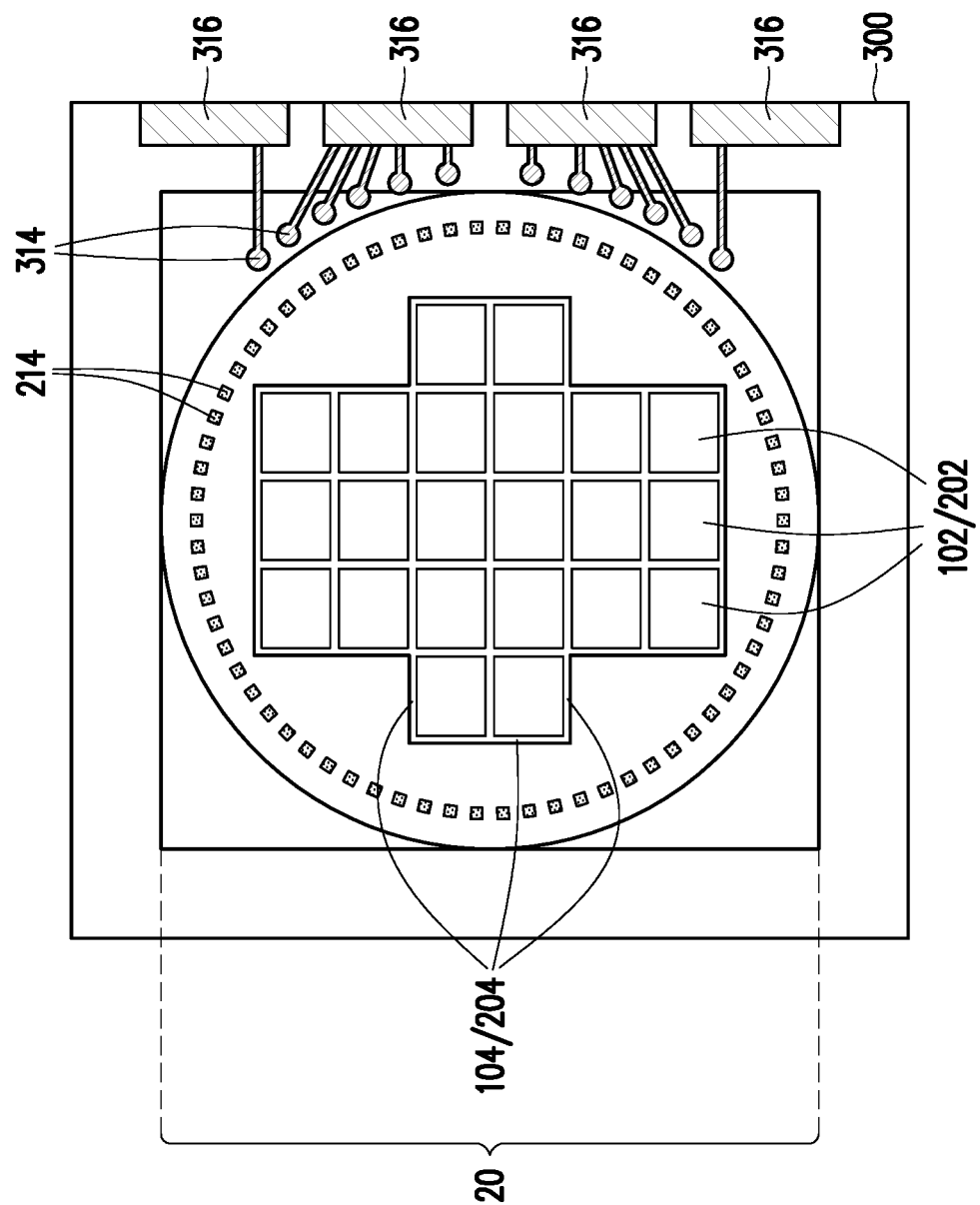

FIGS. 7A and 7B illustrate a cross-sectional view and a top view, respectively, in the adhering of package 20 to PCB 300. The adherence is achieved, for example, through TIM 308 and adhesive 310. The respective process is illustrated as process 410 in the process flow shown in FIG. 26. In accordance with some embodiments of the present disclosure, package 20 is placed into recess 302 (FIG. 6). The top surface of package component 200 may be level with, higher than, or lower than, the top surface of PCB 300. As is shown in FIG. 7B, the size and the shape of package 20 fit the respective size and the shape of recess 302, so that package 20 is secured on PCB 300.

Figure 8:
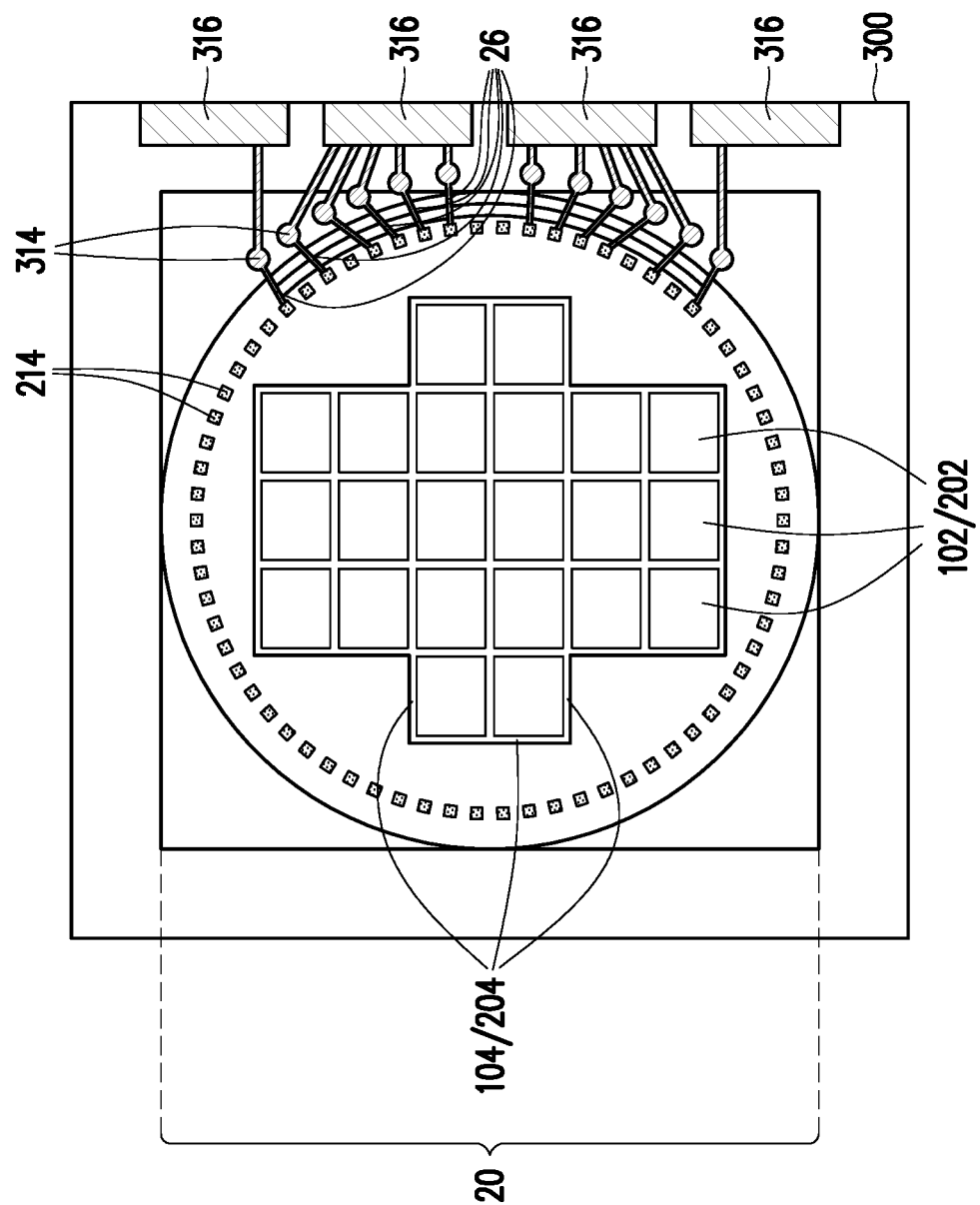

FIG. 8 illustrates the electrical connection of package 20 to PCB 300. The respective process is illustrated as process 412 in the process flow shown in FIG. 26. In accordance with some embodiments of the present disclosure, wire bonding is performed to form wire bonds 26 on bond pads 214 and 314, so that bond pads 214 are electrically connected to bond pads 314. Accordingly, package 20 is electrically connected to electrical connectors 316.

Figure 9:
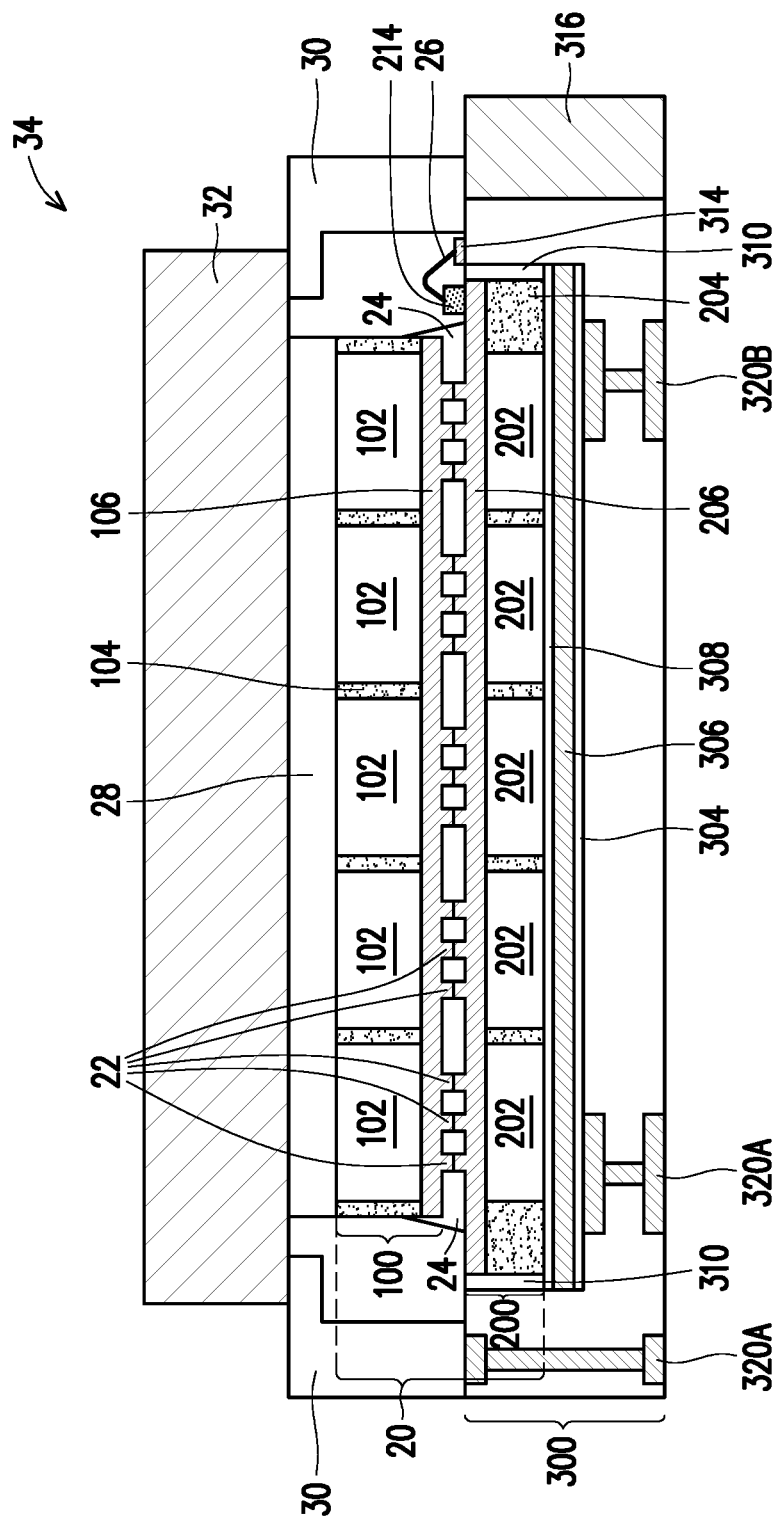

Referring to FIG. 9, TIM 28 is coated or placed on the top of package 20, and mechanical support 30 and cooling system 32 are mounted on PCB 300. The respective processes are illustrated as processes 414 and 416, respectively, in the process flow shown in FIG. 26. Mechanical support 30 may be a metal frame, for example. Cooling system 32 may include a metal plate with fins, a metal plate with a conduit therein for conducting a coolant (such as water, oil, or cool air), or the like. Package 34 is thus formed. Package 34 may also be an electronics card. Package 34 may be used by inserting the end having electrical connectors 316 into a slot of a rack, with electrical connectors 316 contacting the electrical connectors of the rack. Alternatively, pins (not shown) may be mounted as the connectors of package 34. The respective process is illustrated as process 418 in the process flow shown in FIG. 26.

FIGS. 10 through 13 illustrate the cross-sectional views of intermediate stages in the formation of a package in accordance with some embodiments of the present disclosure. Unless specified otherwise, the materials and the formation methods of the components in these embodiments are essentially the same as the like components, which are denoted by like reference numerals in the embodiments shown in FIGS. 1 through 9. The details regarding the formation process and the materials of the components shown in FIGS. 10 through 13 (and in FIGS. 14 through 23) may thus be found in the discussion of the embodiments shown in FIGS. 1 through 9.

Figure 10:
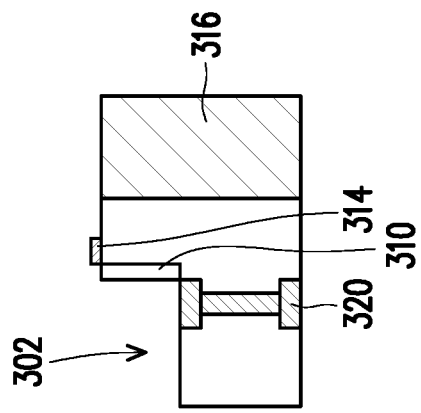
FIGS. 10 through 13 illustrate the top views and cross-sectional views of intermediate stages in the formation of an electronics card in accordance with some embodiments.
Figure 10:
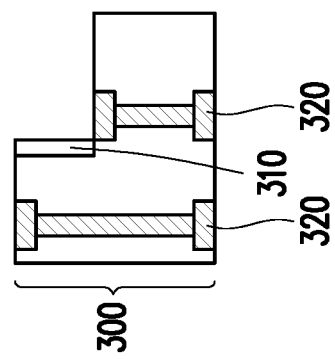

FIG. 10 illustrates PCB 300 in accordance with some embodiments of the present disclosure. PCB 300 as shown in FIG. 10 is similar to the PCB 300 shown in FIG. 6, except recess 330 is formed extending from the bottom surface of PCB 300 to the intermediate level to which recess 302 extends. Recess 330 joins recess 302 to form a continuous recess that penetrates through PCB 300. Recess 330, when viewed from top or bottom, is smaller than recess 302. The bottom-view shape of recess 330 may be circular, rectangular, or have other shapes. Adhesive 310 is dispensed in recess 302. In accordance with some embodiments of the present disclosure, the PCB 300 in FIG. 10 includes active conductive traces 320, and may or may not include dummy conductive traces.

Figure 11:
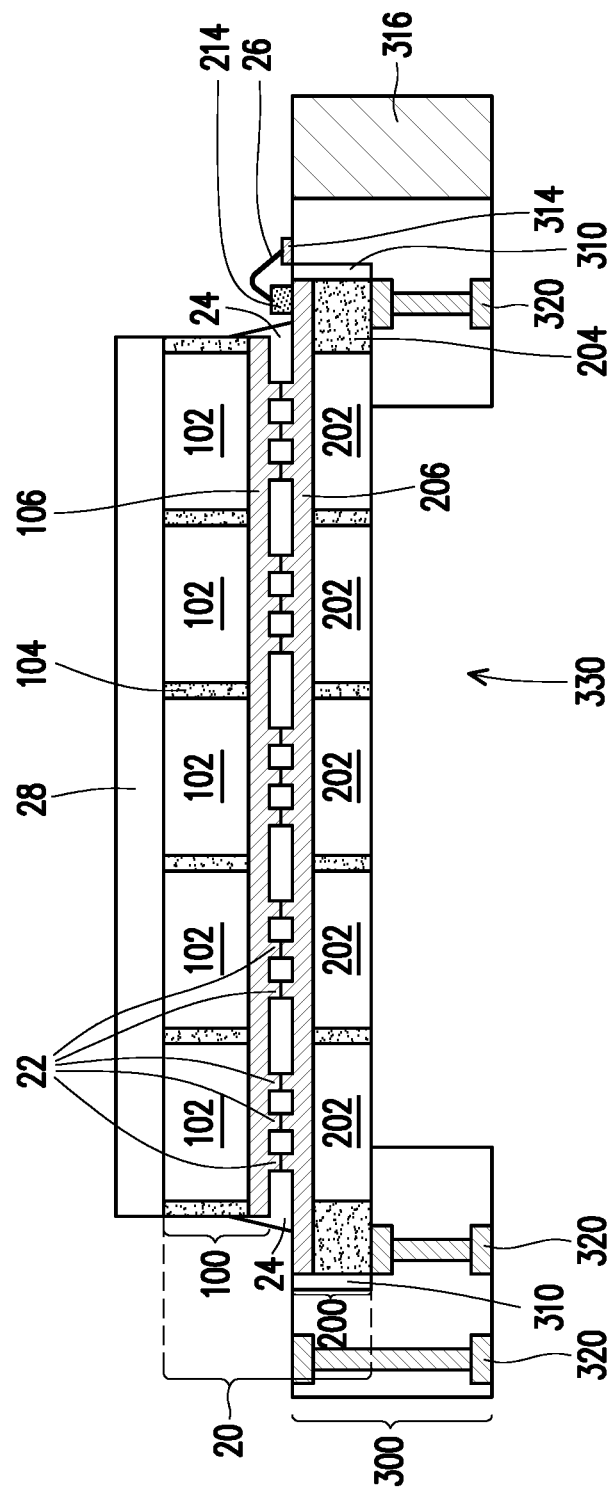

Referring to FIG. 11, package 20 is adhered to PCB 300, for example, through adhesive 310. The formation of package 20 has been discussed referring to FIGS. 1 through 5A/5B and FIG. 24, and the details are not repeated herein. When recess 302 (FIG. 10) is formed, at least a bottom part of package 20 extends into recess 302. For example, package component 200 may be fully or partially in recess 302. Next, a wire bonding is performed on bond pads 214 and 314 so that bond pads 214 and 314 are electrically connected through bond wires 26. The bottom of package 20 is revealed to recess 330. TIM 28 is dispensed on top of package 20.

Figure 12:
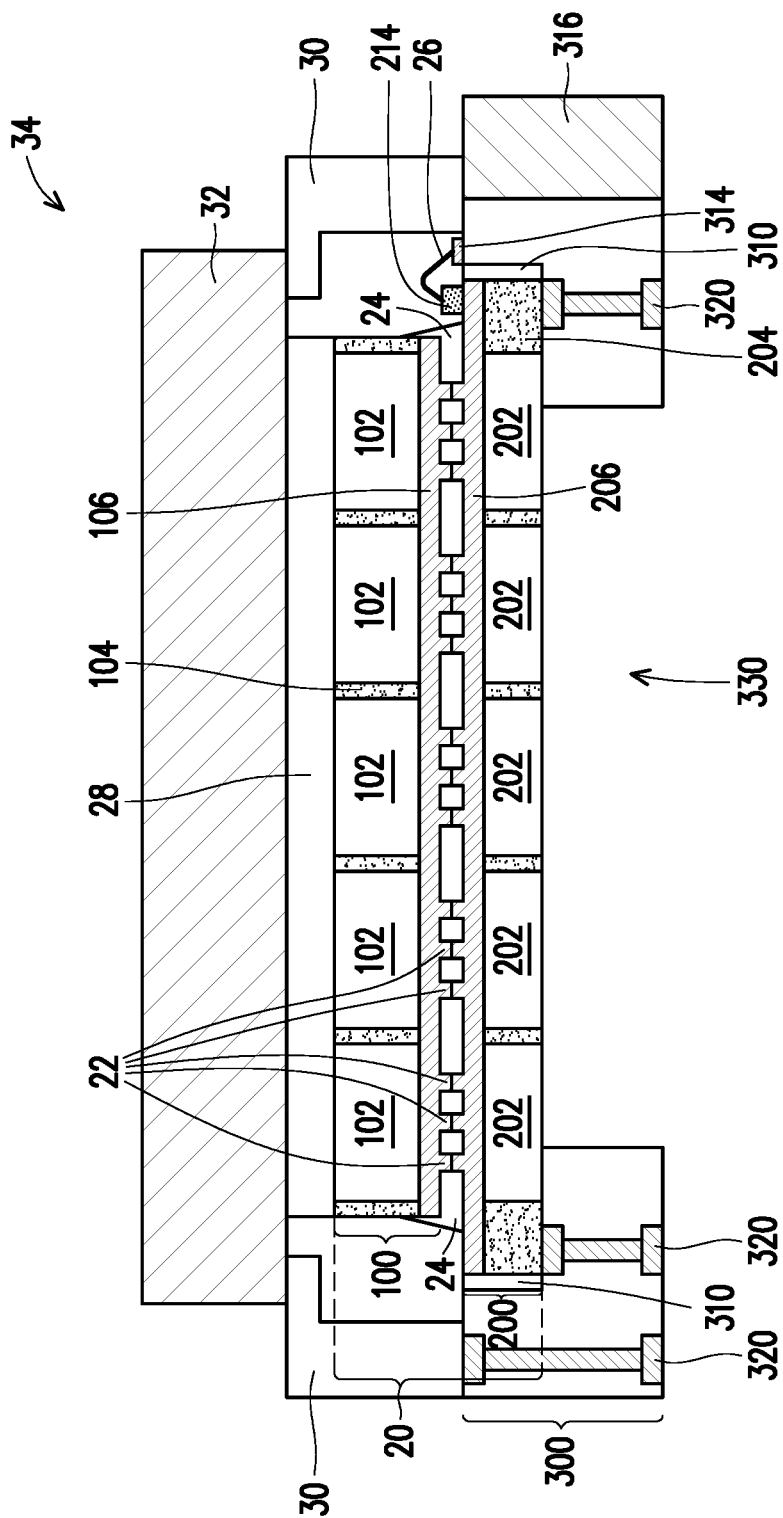
Figure 13:
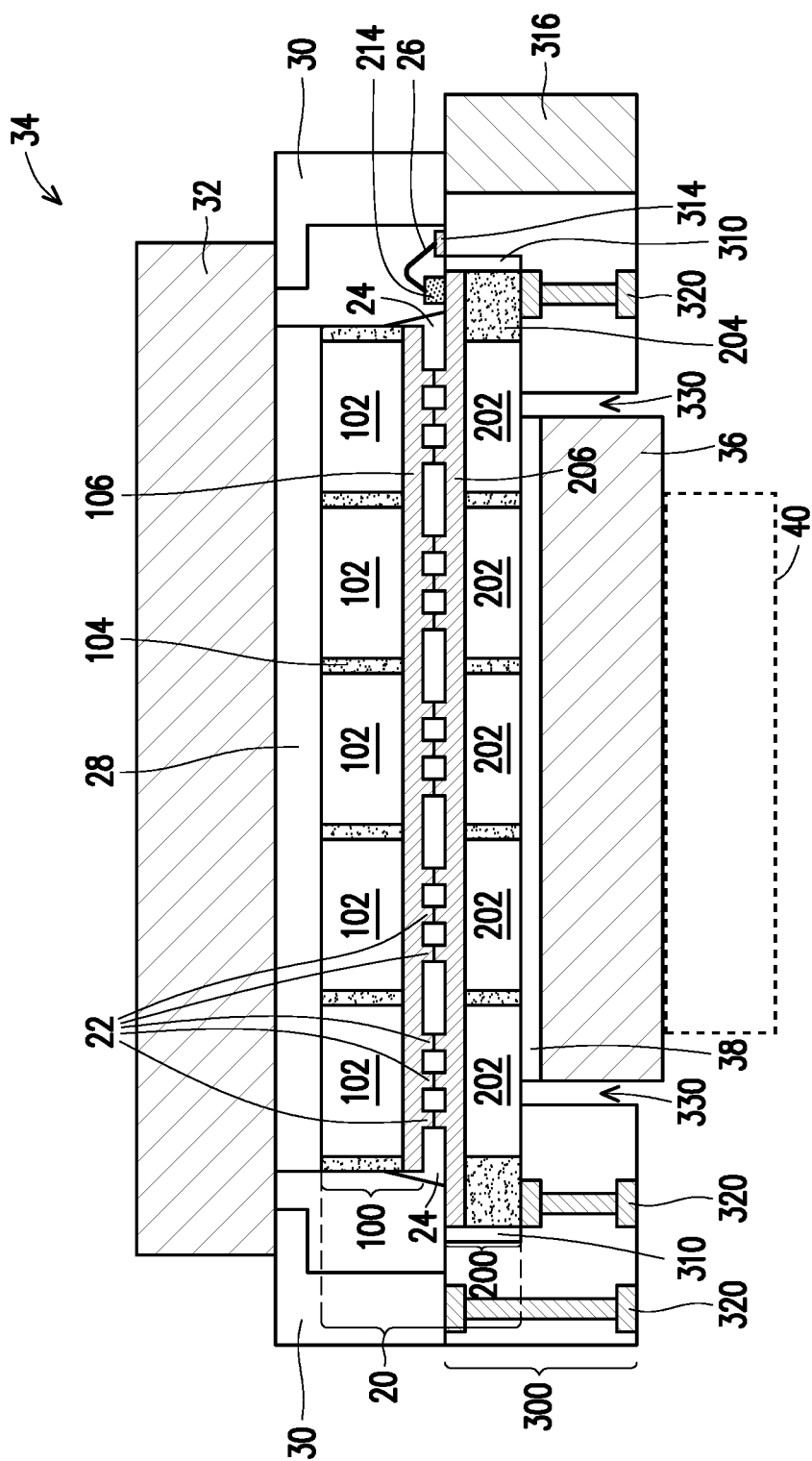

FIG. 12 illustrates the mounting of mechanical support 30 and cooling system 32. Cooling system 32 is in contact with TIM 28, which is dispensed or placed on the top of package 20. Next, as shown in FIG. 13, cooling system 36 is attached to package 20, for example, through TIM 3E. Additional adhesive may be dispensed to join the sidewalls of cooling system 316 to the sidewalls of PCB 300 that face recess 330. Cooling system 316 may also include fins, or may include conduits therein for conducting a coolant. In accordance with some embodiments of the present disclosure, supporting system 410 is attached to the bottom of cooling system 316. Supporting system 410 is used when the resulting package 34 is placed horizontally during its usage since package 34 has a large size, and hence needs support to avoid the problems due to its weight. Supporting system 410 is not mounted if package 34 is used when it is in a vertical direction.

Figure 14:
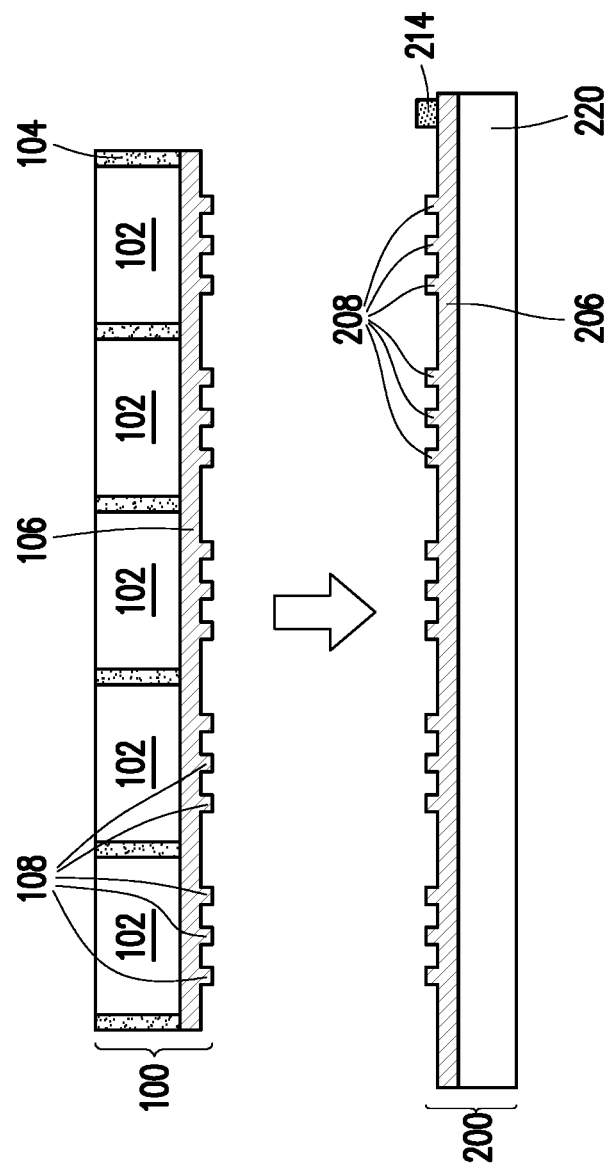
FIGS. 14-18, 19A, 19B, and 20 illustrate the top views and cross-sectional views of intermediate stages in the formation of an electronics card in accordance with some embodiments.
Figure 15:
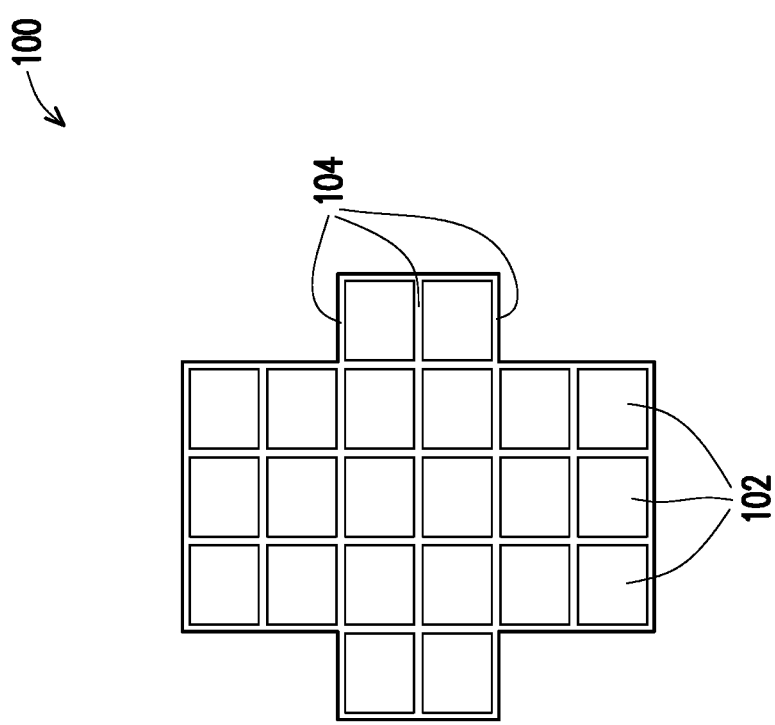

FIGS. 14 through 20 illustrate the formation of package 34 in accordance with some embodiments of the present disclosure. These embodiments are similar to the embodiments shown in FIGS. 1 through 9, except package component 200 does not include device dies (and package components that include device dies). FIG. 14 illustrates the alignment of package component 100 to package component 200. FIG. 15 illustrates a top view of package component 100, which is formed, for example, using essentially the same method and material as shown in FIG. 3. FIG. 24 illustrates some details of package component 100 in accordance with some embodiments of the present disclosure, wherein RDLs 110 and the corresponding dielectric layers 109 are illustrated.

Figure 16:
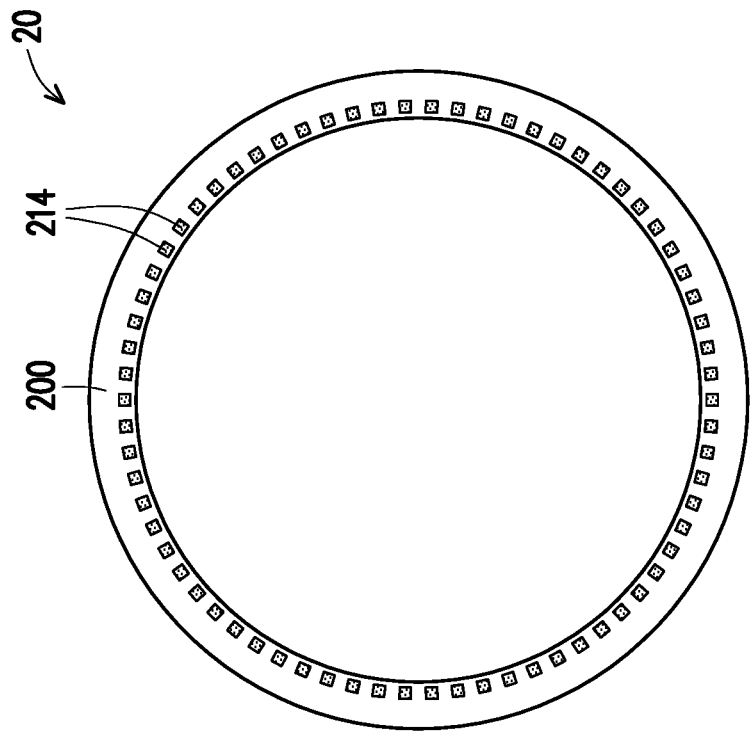
Figure 25:
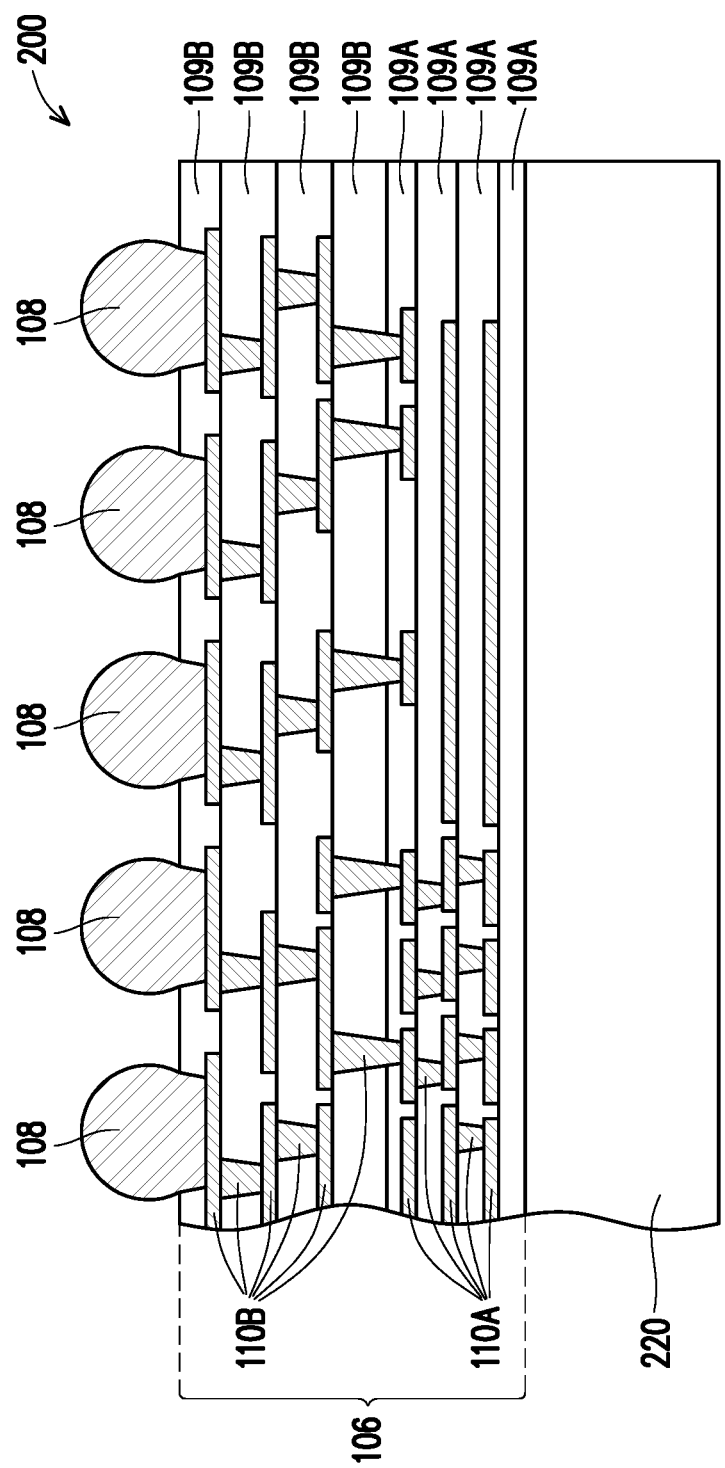

FIG. 16 illustrates a top view of package component 200 in accordance with some embodiments of the present disclosure, which shows bond pads 214 formed in the peripheral region of package component 200. The inner region encircled by the peripheral region includes RDLs therein. FIG. 25 illustrates some details of some parts of package component 200. In accordance with some embodiments of the present disclosure, package component 200 includes RDLs 110 (including 110A and 110B) and the corresponding dielectric layers 109 (including 109A and 109B) formed over blank substrate 220. Dielectric layer 222 may be formed over blank substrate 220, with RDLs 110 formed over dielectric layer 222. The details of RDLs 110 and dielectric layers 109 may be the same as discussed referring to FIG. 24, and hence are not repeated herein.

No active devices such as transistors and diodes are formed on blank substrate 220 in accordance with some embodiments. Furthermore, package component 200 in accordance with some embodiments may be free from, or may include, passive devices such as resistors, capacitors, inductors, or the like in dielectric layers 109. Blank substrate 220 may be formed of a homogenous material, which may be silicon, for example. Alternatively, blank substrate 220 may be a dielectric substrate, which may be formed of silicon oxide, for example. Package component 200 is used for electrical routing.

Figure 17:
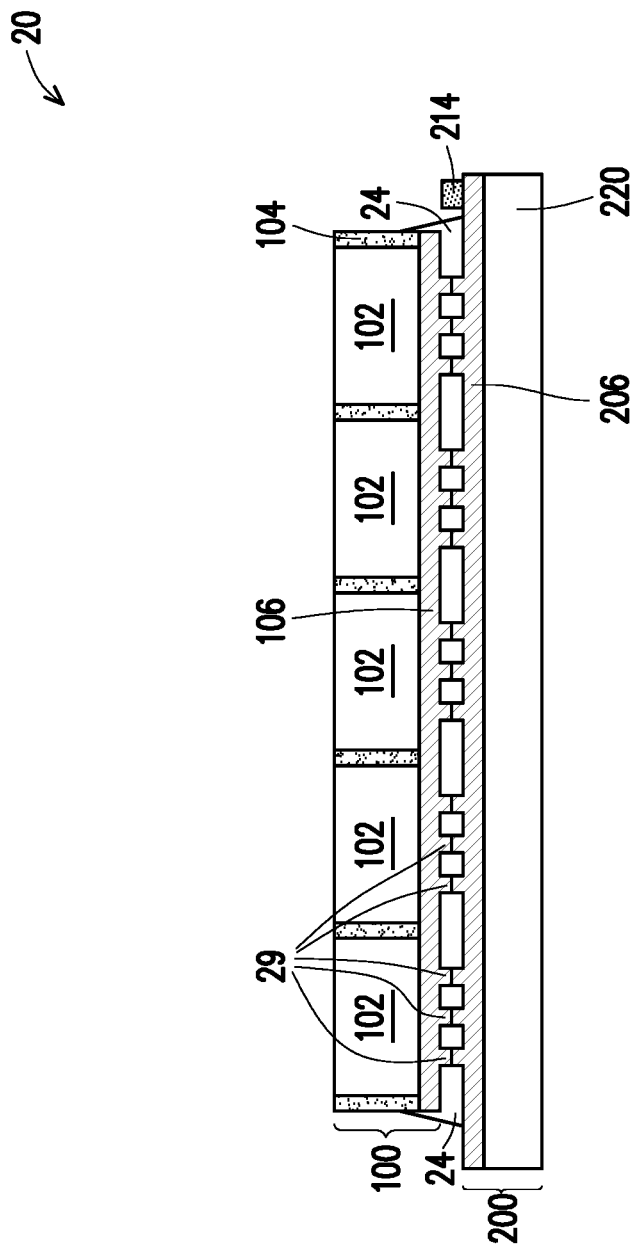

Next, package component 100 is bonded to package component 200, resulting in the package 20 as shown in FIG. 17. Underfill 24 is dispensed into the gap between package components 100 and 200. The top view of package 20 is also shown in FIG. 18.

Figure 18:
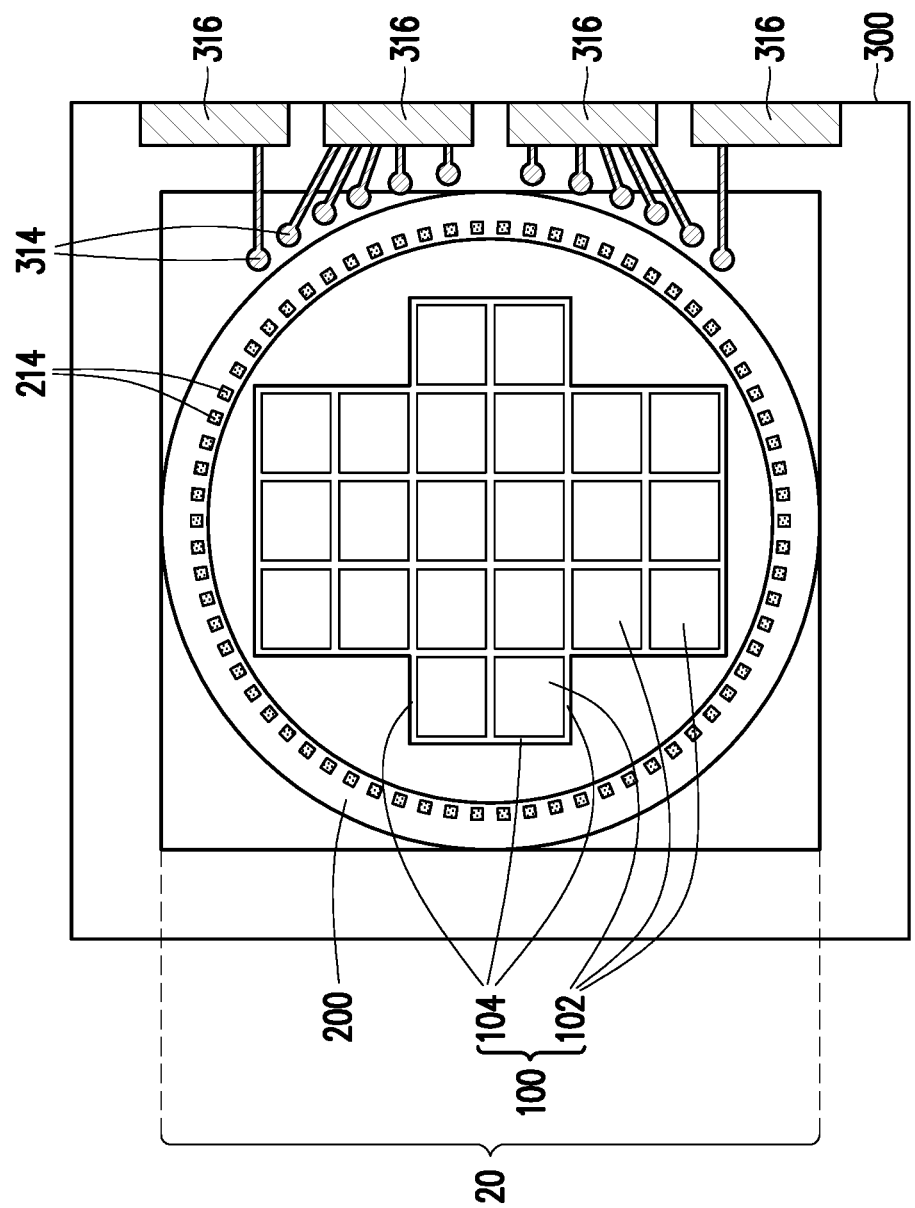
Figure 19A:
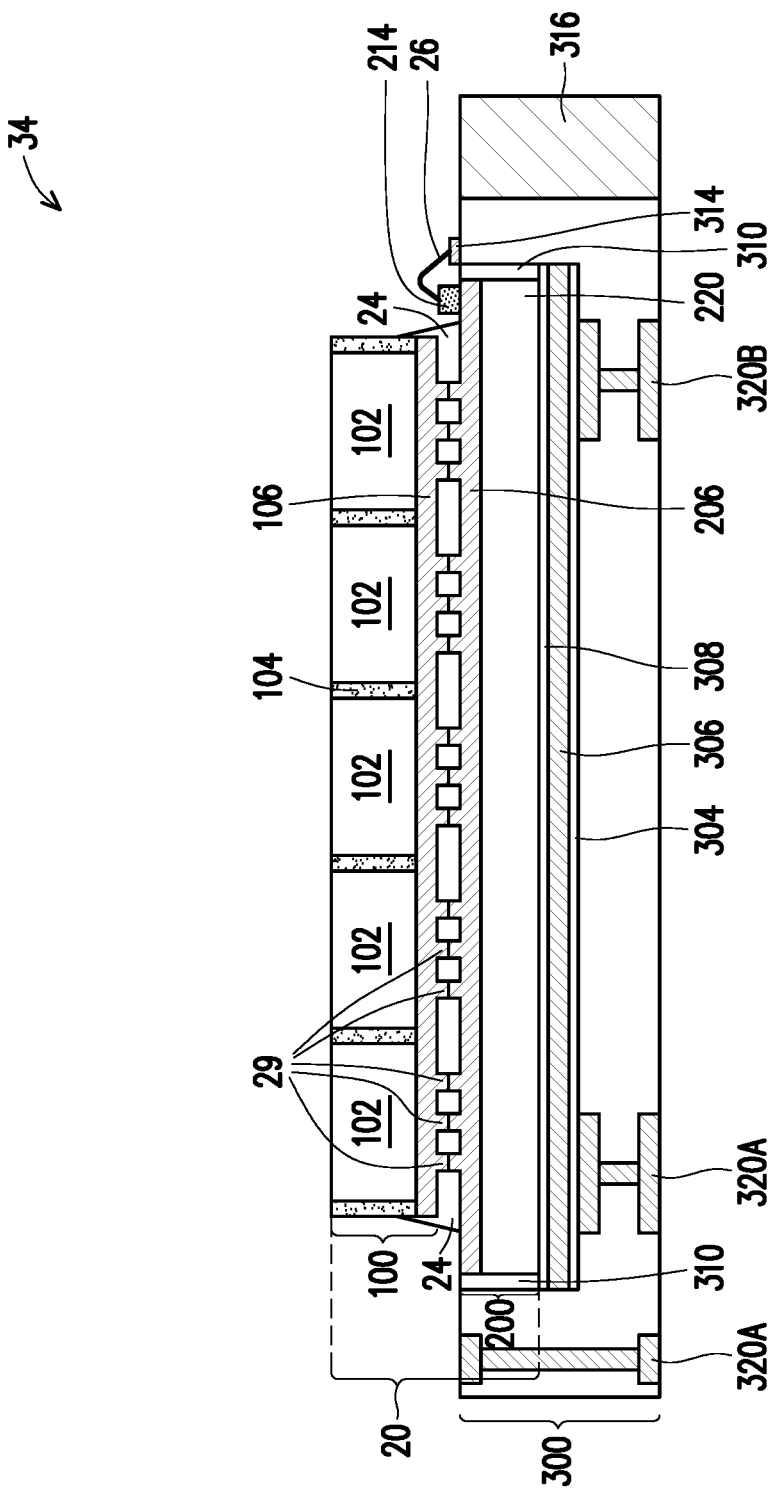
Figure 19B:
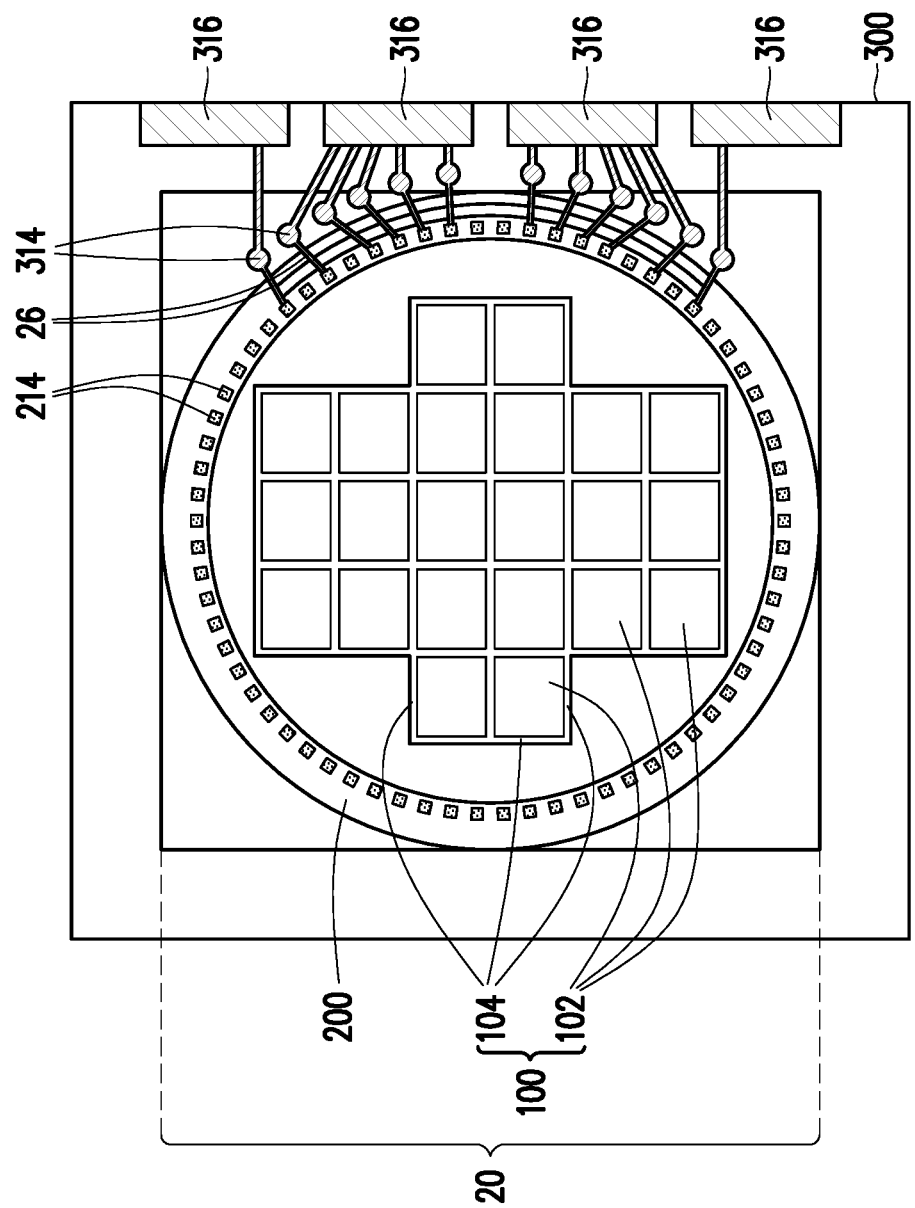

Referring to FIG. 18 package 20 is adhered to PCB 300, which may be essentially the same as shown in FIG. 6. FIG. 19A illustrates a cross-sectional view of the structure shown in FIG. 18. TIMs 304 and 308 and metal plate 306 may be placed in recess 302 (FIG. 6) in PCB 300, similar to what is shown in FIG. 6. Package 20 is adhered to PCB 300 through adhesive 310 (FIG. 6) and TIM 308.

Figure 20:
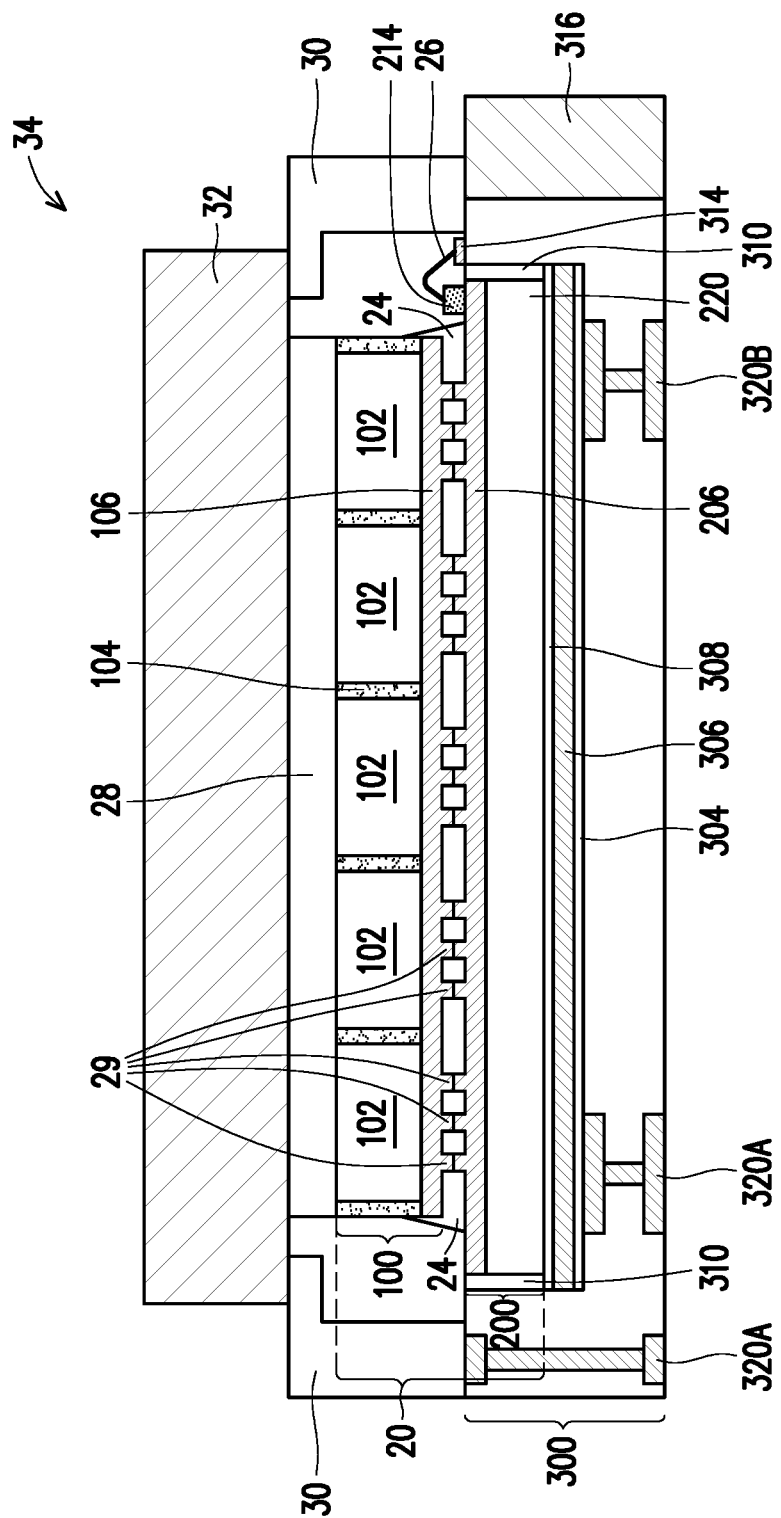

Next, wire bonds 26 are formed to electrically connect package 20 to PCB 300, as also shown in a top view in FIG. 19A. FIG. 20 illustrates the mounting of mechanical support 30 and cooling system 32. The structures, materials, and the mounting method may be essentially the same as discussed referring to FIG. 9. Package (electronics card) 34 is thus formed. In subsequent steps, pins (not shown) may be mounted to connect to electrical connectors 316 if desirable, or package 34 may be inserted into a slot of a rack, with electrical connectors 316 used as the electrical connection.

Figure 21:
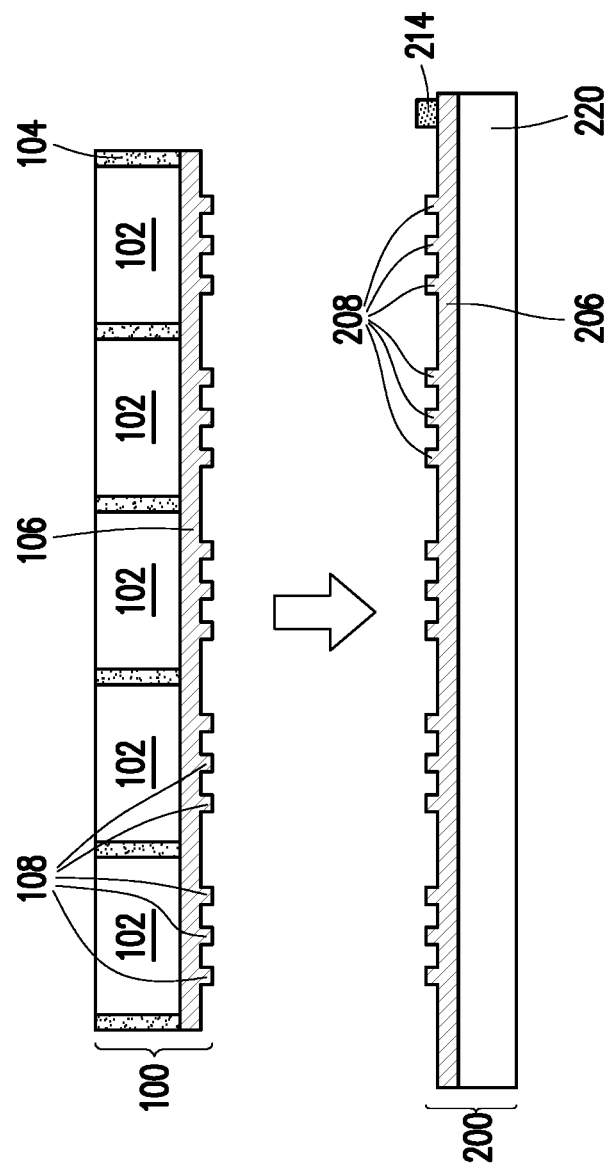
FIGS. 21 through 23 illustrate the top views and cross-sectional views of intermediate stages in the formation of an electronics card in accordance with some embodiments.
Figure 22:
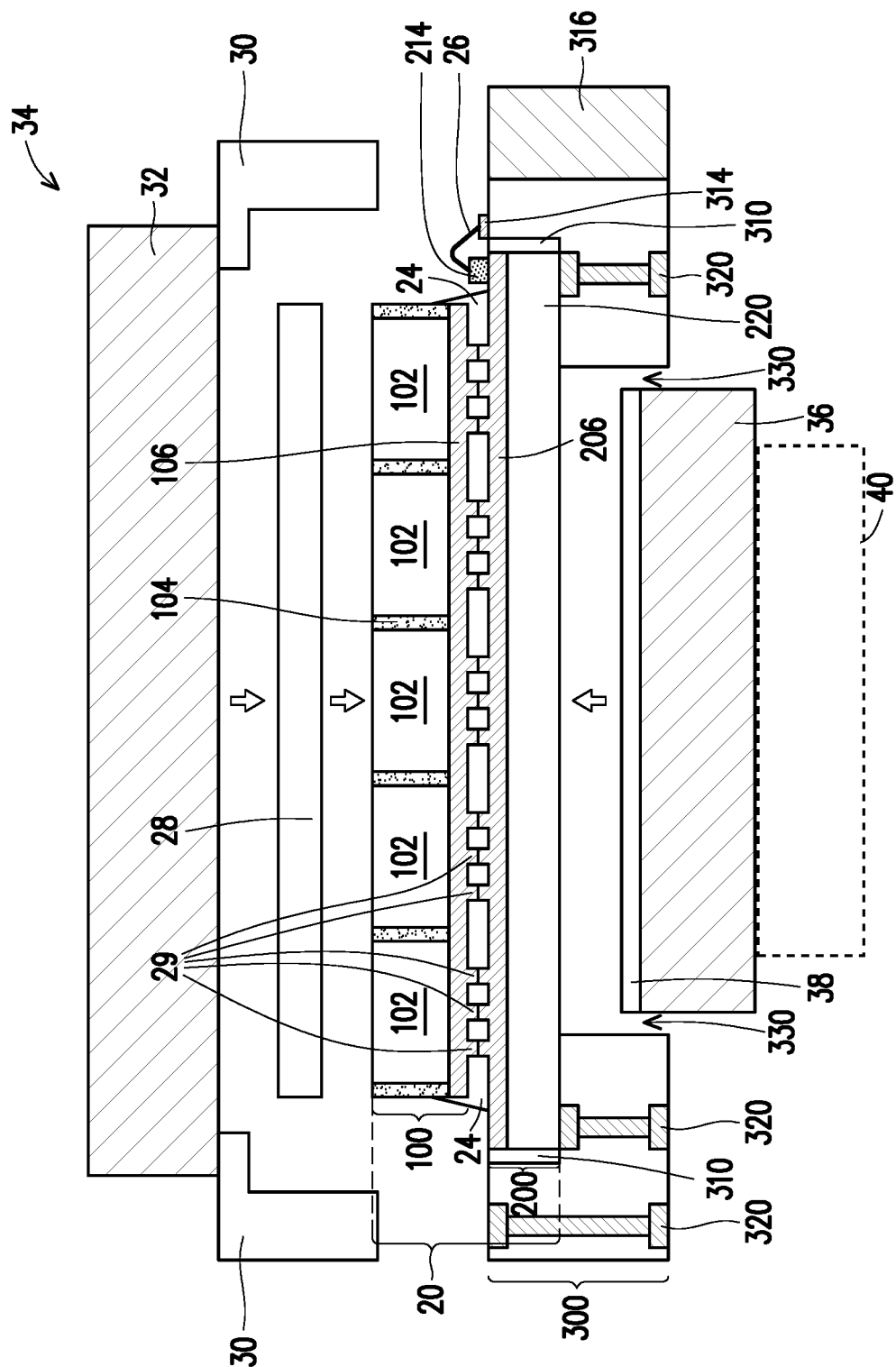
Figure 23:
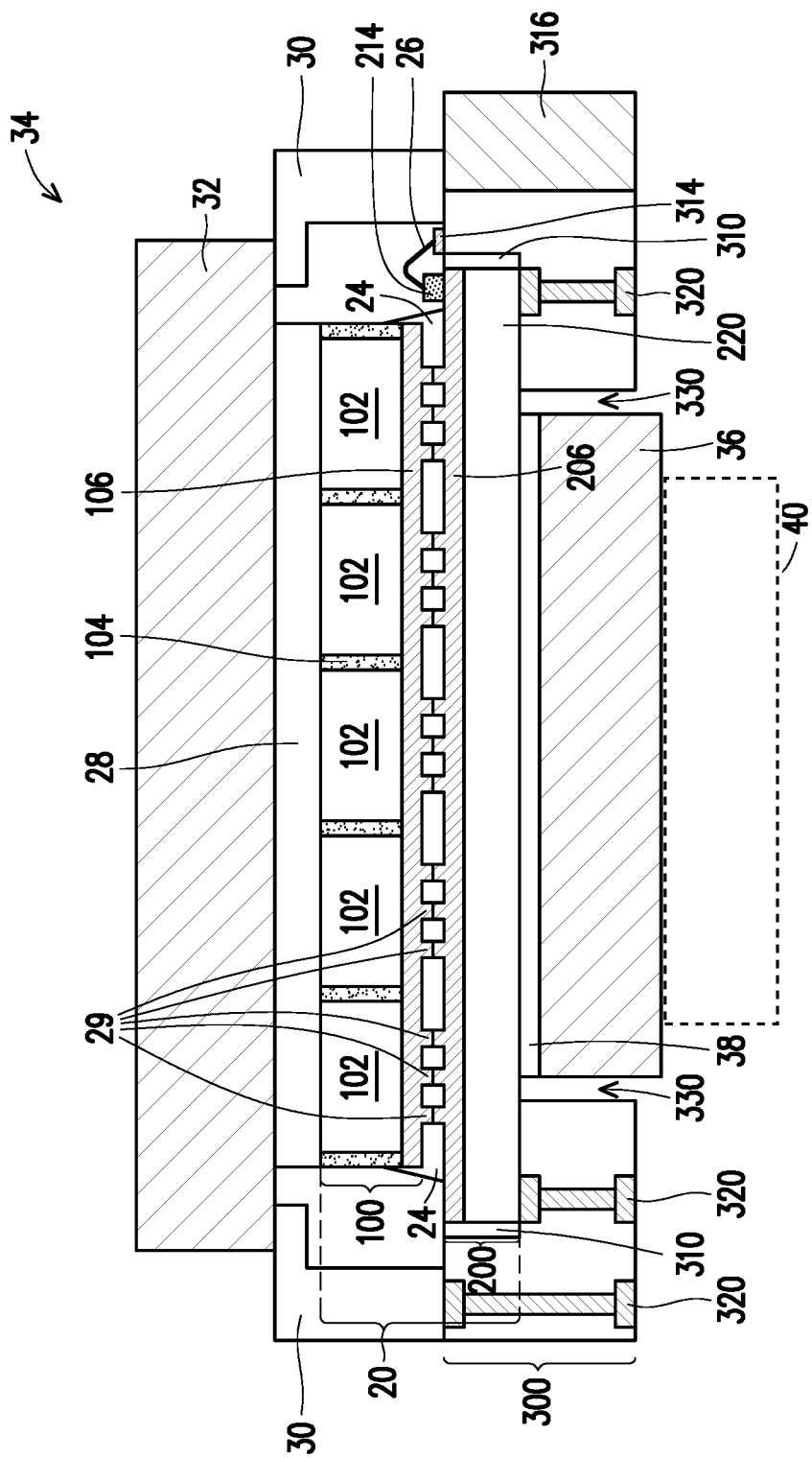

FIGS. 21 through 23 illustrate the formation of package 34 in accordance with some embodiments of the present disclosure. These embodiments are similar to the embodiments shown in FIGS. 1 through 9, except package component 200 has the structure shown in FIG. 25 and is free from device dies and active transistors therein, and opening 330 (FIG. 23) is formed in PCB 300. Referring to FIG. 21, package component 100 is formed, for example, using essentially the same method and material as shown in FIG. 3. Package component 100 is aligned to package component 200, which is described and illustrated referring to FIGS. 16 and 25. Package component 100 is bonded to package component 200, forming package 20 as shown in FIG. 22.

Further referring to FIG. 22, package component 300 is provided. The structure of package component 300 is similar to what is shown in FIG. 10, as has been discussed. The details are thus not repeated herein. Package 20 is adhered to PCB 300, for example, through adhesive 310. Next, a wire bonding process is performed on bond pads 214 and 314 so that bond pads 214 and 314 are electrically connected through bond wires 26. The bottom of package 20 is revealed through recess 330 in PCB 330. Mechanical support 30 and cooling system 32 are then mounted on PCB 300, for example through TIM 28. Cooling system 32 is in contact with TIM 28, which is dispensed on the top of package 20. Next, cooling system 36 is attached to package 20, for example, through TIM 38. Additional adhesive (not shown) may be dispensed to join the sidewalls of cooling system 36 to the sidewalls of PCB 300, which sidewalls face recess 330. Cooling system 36 may include fins, or may include conduits therein for conducting a coolant. In accordance with some embodiments of the present disclosure, supporting system 40 is attached to the bottom of cooling system 316. In accordance with other embodiments of the present disclosure, supporting system 410 is not mounted if the resulting package 34 is to be mounted vertically. FIG. 23 illustrates package 34 after the components as shown in FIG. 22 have been integrated.

In above-illustrated embodiments, some processes and features are discussed in accordance with some embodiments of the present disclosure. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By integrating multiple package components into reconstructed wafers, the integration levels may be improved, and a system may be integrated by bonding reconstructed wafers together. The connection lines of the multiple package components are short, and hence the respective system has improved performance. This allows the system to be used in some performance-demanding applications such as artificial intelligence applications, which require multiple different types of chips for parallel computing. The use of recessed PCB improves the stability of the package and reduces the thickness of the resulting package. Also, the backside opening in the PCB allows for heat dissipation from both sides.

In accordance with some embodiments of the present disclosure, a method includes bonding a first package to a second package to form a third package, wherein the first package is an InFO package comprising a first plurality of package components, wherein the first plurality of package components comprise device dies; and a first encapsulating material encapsulating the first plurality of package components therein; placing at least a portion of the third package into a first recess in a PCB, wherein the first recess extends from a top surface of the PCB to an intermediate level between the top surface and a bottom surface of the PCB; and performing wire bonding to electrically connect the third package to the PCB. In an embodiment, the method further includes forming the second package comprising: forming a plurality of redistribution lines over a blank substrate, wherein the plurality of redistribution lines are between the blank silicon substrate and the first package. In an embodiment, the method further includes forming the second package comprising: encapsulating a second plurality of package components in a second encapsulating material; and forming a plurality of redistribution lines over and electrically connecting to the second plurality of package components, wherein the second plurality of package components comprise additional device dies. In an embodiment, the second package is an un-sawed wafer. In an embodiment, the forming the first package comprises: encapsulating the first plurality of package components in the first encapsulating material; and trimming edge portions of the first encapsulating material. In an embodiment, the PCB further comprises a second recess extending from the bottom surface of the PCB to the intermediate level, and the method further comprises: attaching a cooling system to the third package, wherein the cooling system extends into the second recess. In an embodiment, the method further includes adhering a metal plate to the PCB through a TIM, wherein the PCB comprises a dummy metal feature penetrating through the PCB, with the TIM overlapping the dummy metal feature.

In accordance with some embodiments of the present disclosure, a method includes reconstructing a first wafer comprising: encapsulating a first plurality of package components in a first encapsulating material, wherein the first plurality of package components comprise different types of device dies; forming a first plurality of RDLs overlapping the first encapsulating material and the first plurality of package components; and forming first electrical connectors over and electrically connecting to the first plurality of RDLs; reconstructing a second wafer; bonding the first wafer to the second wafer to form a package; adhering the package to a printed circuit board; and electrically connecting first conductive features on the package to second conductive features on the printed circuit board. In an embodiment, the reconstructing the second wafer comprises: encapsulating a second plurality of package components in a second encapsulating material; and forming a second plurality of RDLs connecting to the second plurality of package components. In an embodiment, the method further includes trimming edge portions of the first wafer before the bonding the first wafer to the second wafer. In an embodiment, after the trimming, all device dies encapsulated by the first encapsulating material remain in the first wafer, and the all device dies are in the package when attached to the printed circuit board. In an embodiment, the reconstructing the second wafer comprises: forming a second plurality of RDLs over a blank silicon substrate, wherein the second plurality of RDLs are between the blank silicon substrate and the first wafer. In an embodiment, the reconstructing the second wafer comprises: encapsulating a second plurality of package components in a second encapsulating material; and forming a second plurality of RDLs over and electrically connecting to the second plurality of package components. In an embodiment, the method further includes rises dispensing an underfill between the first wafer and the second wafer. In an embodiment, the method further includes attaching a cooling system from a bottom of the package, wherein a portion of the cooling system extends into the printed circuit board.

In accordance with some embodiments of the present disclosure, a package includes a first wafer comprising a first plurality of package components, which comprise first device dies; a first encapsulant encapsulating the first plurality of package components therein; and first redistribution lines interconnecting the first plurality of package components; a second wafer bonded to the first wafer, wherein the second wafer comprises: a second plurality of package components comprising second device dies; a second encapsulant encapsulating the second plurality of package components therein; and second redistribution lines interconnecting the second plurality of package components; a printed circuit board, wherein the second wafer is adhered to the printed circuit board; and electrical connections connecting first bond pads on the second wafer to bond pads on the printed circuit board. In an embodiment, the second wafer extends into the printed circuit board. In an embodiment, substantially an entirety of the second wafer is inside the printed circuit board. In an embodiment, the package further includes electrical connectors on a side of the printed circuit board, wherein the electrical connectors are configured to be inserted into a socket. In an embodiment, the package further includes a cooling system extending into the printed circuit board, wherein the cooling system is attached to a backside of the second wafer. Package includes a first wafer comprising a first plurality of package components comprising first device dies; a first encapsulant encapsulating the first plurality of package components therein; and first redistribution lines interconnecting the first plurality of package components; a second wafer bonded to the first wafer, wherein the second wafer comprises: a second plurality of package components comprising second device dies; a second encapsulant encapsulating the second plurality of package components therein; and second redistribution lines interconnecting the second plurality of package components; a printed circuit board, wherein the second wafer is adhered to the printed circuit board; and electrical connections connecting first bond pads on the second wafer to bond pads on the printed circuit board. In an embodiment, the second wafer extends into the printed circuit board. In an embodiment, substantially an entirety of the second wafer is inside the printed circuit board. In an embodiment, the package further includes electrical connectors on a side of the printed circuit board, wherein the electrical connectors are configured to be inserted into a socket. In an embodiment, the package further includes a cooling system extending into the printed circuit board, wherein the cooling system is attached to a backside of the second wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   bonding a first package to a second package to form a third package, wherein the first package is an Integrated Fan-Out (InFO) package comprising:
   a first plurality of package components, wherein the first plurality of package components comprise device dies; and
   a first encapsulating material encapsulating the first plurality of package components therein;
   placing at least a portion of the third package into a first recess in a Printed Circuit Board (PCB), wherein at a time of the placing, the first package is an unsawed reconstructed wafer, and wherein the first recess extends from a top surface of the PCB to an intermediate level between the top surface and a bottom surface of the PCB; and
   performing wire bonding to electrically connect the third package to the PCB.

2. The method of claim 1, further comprising forming the second package comprising:
   forming a plurality of redistribution lines over a substrate, wherein the plurality of redistribution lines is between the substrate and the first package.

3. The method of claim 1, further comprising forming the second package comprising:
   encapsulating a second plurality of package components in a second encapsulating material; and
   forming a plurality of redistribution lines over and electrically connecting to the second plurality of package components, wherein the second plurality of package components comprise additional device dies.

4. The method of claim 3, wherein the second package is an un-sawed wafer.

5. The method of claim 1, further comprising forming the first package comprises:

encapsulating the first plurality of package components in the first encapsulating material; and trimming edge portions of the first encapsulating material.

6. The method of claim 1, wherein the PCB further comprises a second recess extending from the bottom surface of the PCB to the intermediate level, and the method further comprises:

attaching a cooling system to the third package, wherein the cooling system extends into the second recess, and wherein the PCB is free from solder regions directly underlying the cooling system.

7. The method of claim 1, further comprising adhering a metal plate to the PCB through a Thermal Interface Material (TIM), wherein the PCB comprises a dummy metal feature penetrating through the PCB, with the TIM overlapping the dummy metal feature.

8. A method comprising:

reconstructing a first wafer comprising:
encapsulating a first plurality of package components in a first encapsulating material, wherein the first plurality of package components comprise different types of device dies;
forming a first plurality of Redistribution Lines (RDLs) overlapping the first encapsulating material and the first plurality of package components; and
forming first electrical connectors over and electrically connecting to the first plurality of RDLs;

reconstructing a second wafer;

trimming edge portions of the first wafer, wherein after the trimming, all active devices and RDLs are left in the first wafer;

after the trimming, bonding the first wafer to the second wafer to form a package;

adhering the package to a printed circuit board; and electrically connecting first conductive features on the package to second conductive features on the printed circuit board.

9. The method of claim 8, wherein the reconstructing the second wafer comprises:

encapsulating a second plurality of package components in a second encapsulating material; and forming a second plurality of RDLs connecting to the second plurality of package components.

10. The method of claim 9, wherein after the trimming, all device dies encapsulated by the first encapsulating material remain in the first wafer that has been bonded to the second wafer, and the all device dies are in the package when attached to the printed circuit board.

11. The method of claim 8, wherein the reconstructing the second wafer comprises:

forming a second plurality of RDLs over a substrate, wherein the second plurality of RDLs are between the substrate and the first wafer.

12. The method of claim 8, wherein the reconstructing the second wafer comprises:

encapsulating a second plurality of package components in a second encapsulating material; and forming a second plurality of RDLs over and electrically connecting to the second plurality of package components.

13. The method of claim 8, further comprises dispensing an underfill between the first wafer and the second wafer.

14. The method of claim 8, further comprising attaching a cooling system from a bottom side of the package, wherein a portion of the cooling system extends into the printed circuit board, and wherein a portion of the cooling system extends below a bottom surface of the printed circuit board.

15. A method comprising:

forming a first reconstructed wafer, wherein the first reconstructed wafer comprises:
a first plurality of device dies; and
a first encapsulant encapsulating the first plurality of device dies therein;

forming a second reconstructed wafer, wherein the second reconstructed wafer comprises:
a second plurality of device dies; and
a second encapsulant encapsulating the second plurality of device dies therein;

bonding the first reconstructed wafer to the second reconstructed wafer; and after the bonding, placing the second reconstructed wafer into a recess in a package component, wherein at a time of the placing, both of the first reconstructed wafer and the second reconstructed wafer are unsawed round wafers, and wherein the package component comprises redistribution lines therein, and wherein the first reconstructed wafer is higher than the package component.

16. The method of claim 15, wherein the package component comprises:

a first conductive feature penetrating through the package component, wherein the first conductive feature is on a first side of the second reconstructed wafer, wherein the first conductive feature is electrically connected to a metal pad in the package component; and a second conductive feature penetrating through the package component, wherein the second conductive feature is directly under the second reconstructed wafer.

17. The method of claim 15 further comprising forming wire bonds to electrically connect the second reconstructed wafer to the package component.

18. The method of claim 15 further comprising adhering a metal plate to the package component through a first Thermal Interface Material (TIM), with the metal plate being placed in the recess, wherein the second reconstructed wafer is placed over the metal plate.

19. The method of claim 18, wherein the second reconstructed wafer is adhered to the metal plate through a second TIM.

20. The method of claim 15, wherein the first plurality of device dies comprises different types of device dies.

21. The method of claim 16, wherein the first conductive feature comprises:

a first conductive pad and a second conductive pad; and a conductive trace connecting the first conductive pad and the second conductive pad.

* * * * *